(12) United States Patent
Mizusaki et al.

(10) Patent No.: US 11,078,324 B2
(45) Date of Patent: Aug. 3, 2021

(54) SEAL MATERIAL COMPOSITION, LIQUID CRYSTAL CELL, AND SCANNED ANTENNA

(71) Applicant: Sharp Kabushiki Kaisha, Sakai (JP)

(72) Inventors: Masanobu Mizusaki, Sakai (JP); Tadashi Ohtake, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 209 days.

(21) Appl. No.: 16/341,472

(22) PCT Filed: Oct. 20, 2017

(86) PCT No.: PCT/JP2017/037948
§ 371 (c)(1),
(2) Date: Apr. 12, 2019

(87) PCT Pub. No.: WO2018/079427
PCT Pub. Date: May 3, 2018

(65) Prior Publication Data
US 2019/0292307 A1  Sep. 26, 2019

(30) Foreign Application Priority Data

Oct. 28, 2016 (JP) ............................. JP2016-211532

(51) Int. Cl.
| | |
|---|---|
| C08G 59/40 | (2006.01) |
| C09J 4/06 | (2006.01) |
| C09J 163/00 | (2006.01) |
| G02F 1/00 | (2006.01) |
| H01Q 1/00 | (2006.01) |
| H01Q 21/00 | (2006.01) |
| C08G 59/44 | (2006.01) |
| C09K 3/10 | (2006.01) |
| H01L 27/12 | (2006.01) |
| H01Q 1/38 | (2006.01) |
| H01Q 21/06 | (2006.01) |
| H01Q 3/44 | (2006.01) |
| G02F 1/1339 | (2006.01) |
| H01Q 13/22 | (2006.01) |
| H01Q 3/34 | (2006.01) |

(52) U.S. Cl.
CPC ............ *C08G 59/44* (2013.01); *C08G 59/40* (2013.01); *C09K 3/10* (2013.01); *G02F 1/1339* (2013.01); *H01L 27/1255* (2013.01); *H01Q 1/38* (2013.01); *H01Q 3/34* (2013.01); *H01Q 3/44* (2013.01); *H01Q 13/22* (2013.01); *H01Q 21/06* (2013.01); *H01Q 21/064* (2013.01); *H01Q 21/065* (2013.01); *C09K 2003/1068* (2013.01); *C09K 2003/1084* (2013.01)

(58) Field of Classification Search
None
See application file for complete search history.

(56) References Cited

U.S. PATENT DOCUMENTS

| | | | |
|---|---|---|---|
| 2005/0067605 A1 | 3/2005 | Lussem et al. | |
| 2008/0036664 A1 | 2/2008 | Haziza | |
| 2008/0296159 A1* | 12/2008 | Kong | C08G 65/18 204/600 |
| 2009/0091500 A1 | 4/2009 | Haziza | |
| 2009/0207723 A1* | 8/2009 | Ito | C08F 290/06 369/283 |
| 2012/0040190 A1* | 2/2012 | You | C09D 163/00 428/413 |
| 2012/0194399 A1 | 8/2012 | Bily et al. | |
| 2014/0242301 A1 | 8/2014 | Chen | |
| 2014/0266946 A1 | 9/2014 | Bily et al. | |
| 2015/0229028 A1 | 8/2015 | Bily et al. | |
| 2016/0261042 A1 | 9/2016 | Sazegar et al. | |
| 2016/0359234 A1 | 12/2016 | Bily et al. | |
| 2016/0372834 A1 | 12/2016 | Bily et al. | |

FOREIGN PATENT DOCUMENTS

| | | | | |
|---|---|---|---|---|
| JP | 2003327951 A | * | 11/2003 | ............ C08G 59/20 |
| JP | 2009-538565 A | | 11/2009 | |
| JP | 2013-539949 A | | 10/2013 | |
| JP | 2014-532083 A | | 12/2014 | |
| JP | 2016-512408 A | | 4/2016 | |
| WO | WO-2010061634 A1 | * | 6/2010 | ......... H01L 51/5246 |

OTHER PUBLICATIONS

Machine translation of WO-2010061634-A1 (no date).*
Machine translation of JP-2003327951-A (no date).*
Official Communication issued in International Patent Application No. PCT/JP2017/037948, dated Jan. 23, 2018.

* cited by examiner

*Primary Examiner* — Michael J Feely
(74) *Attorney, Agent, or Firm* — Keating & Bennett, LLP

(57) ABSTRACT

A seal material composition according to the present invention includes: an epoxy compound including an epoxy group; and a polymerizable epoxy curing agent including a polymerizable functional group configured for cross-linking the epoxy groups and for radical polymerization in a single molecule.

18 Claims, 7 Drawing Sheets

SEAL MATERIAL COMPOSITION, LIQUID CRYSTAL CELL, AND SCANNED ANTENNA

TECHNICAL FIELD

The present invention relates to a seal material composition, a liquid crystal cell, and a scanned antenna.

BACKGROUND ART

Antennas used for mobile communication, satellite broadcast and the like require a beam scan function for changing the beam direction. As an antenna having such function, a scanned antenna in which the large dielectric anisotropy (birefringence index) of a liquid crystal material (including nematic liquid crystal and polymer-dispersed liquid crystal) is utilized has been proposed (for example, Patent Documents 1 to 3). This type of scanned antenna has a configuration (that is, a liquid crystal cell for the scanned antenna) in which a liquid crystal layer is sandwiched between a pair of electrode-attached substrates.

RELATED ART DOCUMENT

Patent Document

Patent Document 1: Japanese Translation of PCT International Application Publication No. JP-T-2013-539949
Patent Document 2: Japanese Translation of PCT International Application Publication No. JP-T-2016-512408
Patent Document 3: Japanese Translation of PCT International Application Publication No. JP-T-2009-538565

Problem to be Solved by the Invention

A scanned antenna requires a liquid crystal compound having a sufficient level of dielectric constant anisotropy ($\Delta\varepsilon$) for gigahertz band. Accordingly, as a liquid crystal compound for a scanned antenna, it is substantially indispensable to use an isothiocyanate group-containing liquid crystal compound having a high dielectric constant anisotropy.

According to a liquid crystal cell producing method involving a step of providing a liquid crystal material by a one drop fill (ODF) method, uncured seal material (seal material composition) is formed in a frame shape on a substrate before bonding. Then, liquid crystal material is dropped onto the substrate so as to be disposed on the inside of the frame-shaped seal material. The liquid crystal material that has been dropped extends on the substrate, and may likely to come into contact with the uncured seal material. In this case, if an isothiocyanate group-containing liquid crystal compound is included in the liquid crystal material, curing agent (such as diamine or dihydrazide) and water content included in the seal material may react with the isothiocyanate group-containing liquid crystal compound, forming a deposit in the liquid crystal material (liquid crystal layer).

FIG. 1 is an illustrative diagram illustrating a reaction between an isothiocyanate group-containing liquid crystal compound (a-1) and a curing agent (a-2). When the isothiocyanate group-containing liquid crystal compound (a-1) and the curing agent (a-2) react, a compound (a-3) having a "—NH—CS—NH—" link is formed. Since the "—NH—CS—NH—" link has high polarity, it cannot maintain a dissolved state in the liquid crystal material (liquid crystal layer) and is deposited. When such deposit is generated in the liquid crystal cell for a scanned antenna, for example, the problem of an operation failure is caused in the scanned antenna.

DISCLOSURE OF THE PRESENT INVENTION

An object of the present invention is to provide a seal material composition and the like for suppressing the formation of a deposit in a liquid crystal layer of a liquid crystal cell utilized for a scanned antenna and the like.

Means for Solving the Problem

A seal material composition according to the present invention includes: an epoxy compound including an epoxy group; and a polymerizable epoxy curing agent including a polymerizable functional group configured for cross-linking the epoxy groups and configured for radical polymerization in a single molecule.

Preferably, in the seal material composition, the polymerizable epoxy curing agent may be made of a compound expressed by the following chemical formula (1-1), (1-2), or (1-3).

[C 1]

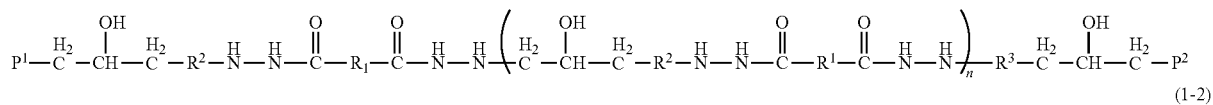

(1-1)

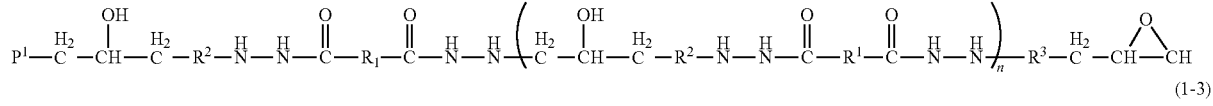

(1-2)

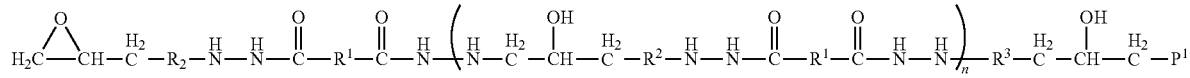

(1-3)

(In chemical formulas (1-1), (1-2), and (1-3), n is an integer of 0 to 10, $R^1$ is an alkylene group having 1 to 10 carbon atoms or a group represented by the following chemical formula (2), $R^2$ is a group represented by the following chemical formula (3-1), (3-2), (3-3), (3-4), (3-5), or (3-6), $R^3$ is a group represented by the following chemical formula (4-1), (4-2), (4-3), (4-4), (4-5), or (4-6), and $P^1$ and $P^2$ are groups which are represented by the following chemical formula (5-1), (5-2), (5-3), or (5-4) and which may be the same or different from each other.)

[C 2]

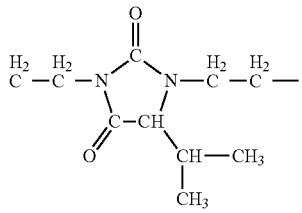
(2)

[C 3]

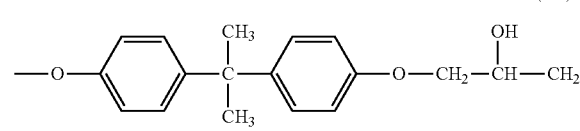
(3-1)

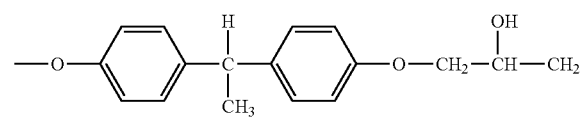
(3-2)

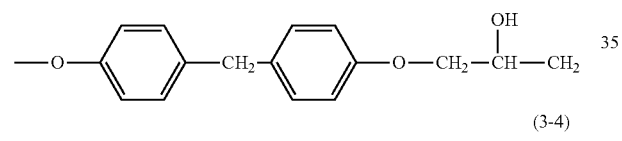
(3-3)

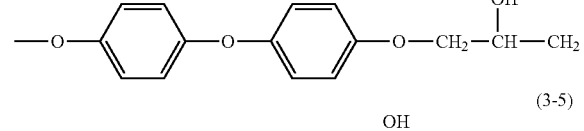
(3-4)

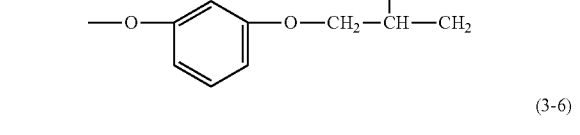
(3-5)

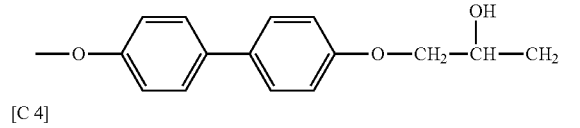
(3-6)

[C 4]

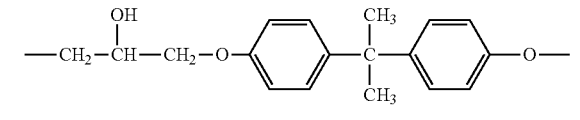
(4-1)

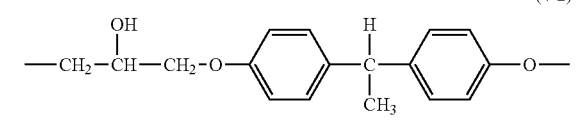
(4-2)

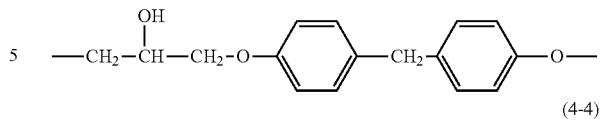
(4-3)

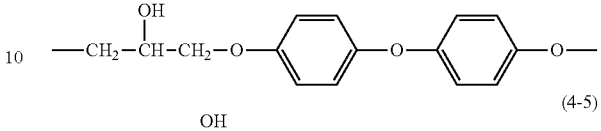
(4-4)

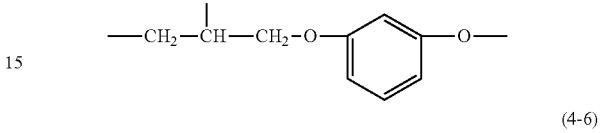
(4-5)

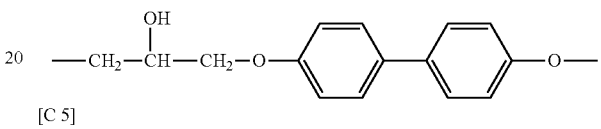
(4-6)

[C 5]

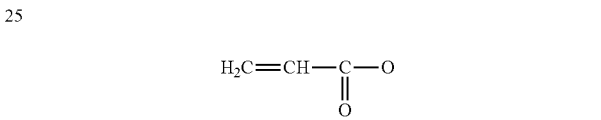
(5-1)

(5-2)

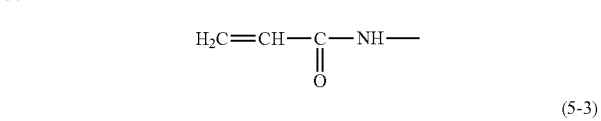

(5-3)

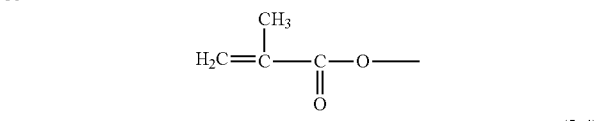

(5-4)

Preferably, in the seal material composition, of the $P^1$ and $P^2$, at least one may be an acryloyl amino group represented by chemical formula (5-2) or a methacryloyl amino group represented by chemical formula (5-4).

Preferably, the seal material composition may include a photoradical polymerization initiator that forms a radical by abstracting hydrogen.

Preferably, in the seal material composition, the photoradical polymerization initiator may include a polymerizable functional group configured for radical polymerization.

Preferably, in the seal material composition, the photoradical polymerization initiator may form a radical via a hydrogen abstraction reaction using light of not less than 400 nm.

Preferably, the seal material composition may include a thermal radical polymerization initiator including a polymerizable functional group configured for radical formation and radical polymerization due to heat.

Preferably, in the seal material composition, the thermal radical polymerization initiator may be made from a compound expressed by the following chemical formula (6-1) or (6-2).

[C 6]

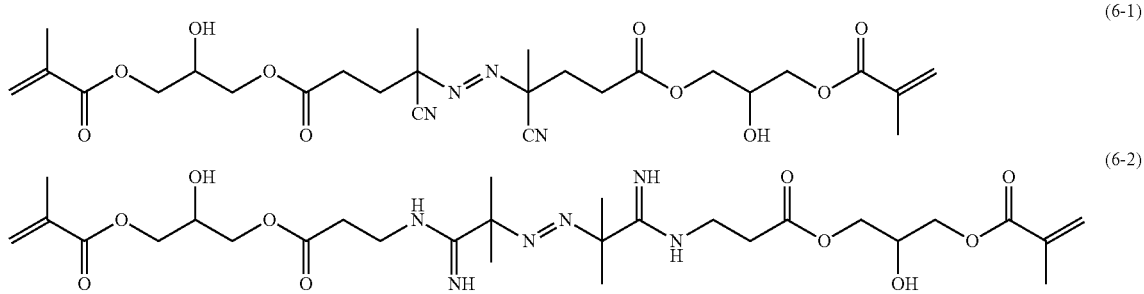

(6-1)

(6-2)

A liquid crystal cell according to the present invention includes: a liquid crystal layer; a pair of substrates made of a first substrate and a second substrate facing each other with the liquid crystal layer sandwiched therebetween; and a seal material made of a cured product of any one of the seal material compositions described above, wherein the seal material is interposed between the pair of substrates and adhered to each of the pair of substrates while surrounding the liquid crystal layer.

Preferably, in the liquid crystal cell, the first substrate may be made of a TFT substrate including a first dielectric substrate, TFTs supported on the first dielectric substrate, and patch electrodes electrically connected to the TFTs, and the second substrate may be made of a slot substrate including a second dielectric substrate and a slot electrode having slots supported on the second dielectric substrate. The liquid crystal layer may be interposed between the TFT substrate and the slot substrate which are disposed with the patch electrode side and the slot electrode side opposing each other such that the slots are arranged in correspondence to the patch electrodes. The seal material may be interposed between the TFT substrate and the slot substrate.

A scanned antenna according to the present invention includes antenna units being arrayed thereon, the scanned antenna including: a TFT substrate including a first dielectric substrate, TFTs supported on the first dielectric substrate, and patch electrodes electrically connected to the TFTs; a slot substrate including a second dielectric substrate and a slot electrode having slots formed on a first main surface of the second dielectric substrate; a liquid crystal layer disposed between the TFT substrate and the slot substrate; a reflective conductive plate disposed so as to oppose a second main surface on an opposite side to the first main surface of the second dielectric substrate, with a dielectric material layer therebetween; and a seal material made of a cured product of any one of the seal material compositions described above, wherein the seal material is interposed between the TFT substrate and the slot substrate and adhered to each of the TFT substrate and the slot substrate while surrounding the liquid crystal layer.

Preferably, in the scanned antenna, the liquid crystal layer may include an isothiocyanate group-containing liquid crystal compound.

Preferably, in the scanned antenna, the isothiocyanate group-containing liquid crystal compound may include a structure expressed by one of the following chemical formulas (7-1) and chemical formula (7-2).

[C 7]

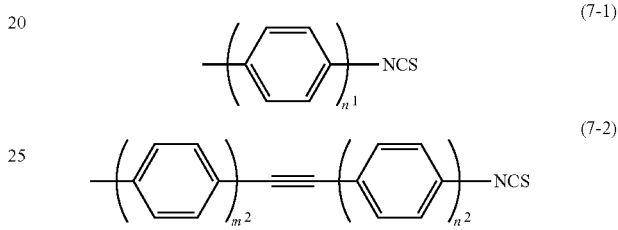

(7-1)

(7-2)

(In chemical formulas (7-1) and (7-2), $n^1$, $m^2$, and $n^2$ are integers of 1 to 5, and H in the phenylene group may be substituted with F or Cl.)

Advantageous Effect of the Invention

According to the present invention, it is possible to provide a seal material composition and the like which suppresses the formation of a deposit in a liquid crystal layer of a liquid crystal cell utilized in a scanned antenna and the like.

MODES FOR CARRYING OUT THE INVENTION

First Embodiment (Basic Structure of Scanned Antenna)

A scanned antenna is provided with a beam scan function for changing a beam direction, and has a structure provided with antenna units in which the anisotropy (birefringence index) of a large dielectric constant M ($\varepsilon M$) of a liquid crystal material is utilized. The scanned antenna controls the voltage applied to the liquid crystal layer of each antenna unit, and varies the effective dielectric constant M ($\varepsilon M$) of the liquid crystal layer of each antenna unit, thereby forming a two-dimensional pattern using the antenna units having different capacitances. The dielectric constant of a liquid crystal material has a frequency dispersion. Accordingly, in the present description, the dielectric constant in the microwave frequency band will be specifically designated as "dielectric constant M ($\varepsilon M$)".

Electromagnetic waves (such as microwaves) emitted from or received by the scanned antenna are given a phase difference corresponding to the capacitance of each antenna unit, and are provided with a strong directivity in a specific direction (beam scan) in accordance with the two-dimensional pattern formed by the antenna units having different capacitances. For example, the electromagnetic waves emitted from the scanned antenna are obtained by integrating the spherical waves obtained as the result of input electromagnetic waves entering each antenna unit and being scattered by each antenna unit, in consideration of the phase difference given by each antenna unit.

Figure 2:
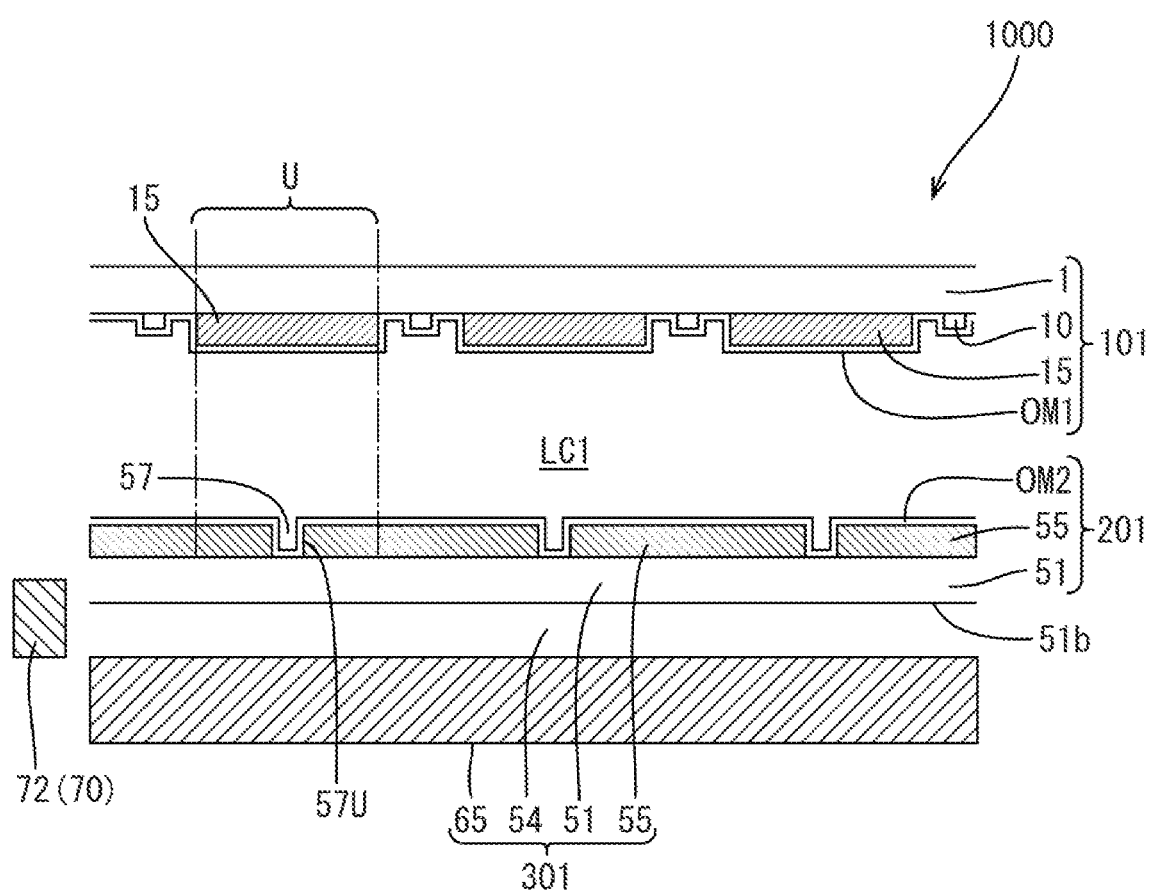
FIG. 2 is a cross-sectional view schematically illustrating a part of a scanned antenna according to a first embodiment.

The basic structure of a scanned antenna according to an embodiment of the present invention will be described with reference to FIG. 2, for example. FIG. 2 is a cross-sectional view schematically illustrating a part of a scanned antenna 1000 according to a first embodiment. The scanned antenna 1000 of the present embodiment is a radial inline slot antenna in which slots 57 are concentrically arrayed. FIG. 2 schematically illustrates a part of a cross section taken in a radius direction from a feed pin 72 concentrically disposed in the vicinity of the center of the arrayed slots. In another embodiment, the slots may be arrayed in various known ways (such as in a spiral or matrix shape).

The scanned antenna 1000 is mainly provided with: a TFT substrate 101 (an example of a first substrate); a slot substrate 201 (an example of a second substrate); a liquid crystal layer LC disposed therebetween; and a reflective conductive plate 65. The scanned antenna 1000 is configured to transmit and receive microwaves from the TFT substrate 101 side. The TFT substrate 101 and the slot substrate 201 are arranged so as to oppose each other with the liquid crystal layer LC sandwiched therebetween.

The TFT substrate 101 (an example of a first substrate) is provided with: a dielectric substrate (an example of a first dielectric substrate) 1, such as a glass substrate; patch electrodes 15 and thin film transistors (TFTs) 10 which are formed on the liquid crystal layer LC side of the dielectric substrate 1; and an alignment film OM1 formed on an outermost surface on the liquid crystal layer LC side. The TFTs 10 are connected with gate bus lines and source bus lines, which are not illustrated in FIG. 2.

The slot substrate 201 (an example of a second substrate) is provided with: a dielectric substrate (an example of a second dielectric substrate) 51, such as a glass substrate; a slot electrode 55 formed on the liquid crystal layer LC side of the dielectric substrate 51; and an alignment film OM2 formed on an outermost surface on the liquid crystal layer LC side. The slot electrode 55 is provided with the slots 57. The surface on the liquid crystal layer LC side of the dielectric substrate 51 will be referred to as a first main surface, and the surface on the opposite side thereof will be referred to as a second main surface.

Preferably, the dielectric substrates 1, 51 used for the TFT substrate 101 and the slot substrate 201 have a small dielectric loss with respect to microwaves, and, other than the glass substrates, it is possible to utilize plastic substrates. The thickness of the dielectric substrates 1, 51 is not particularly limited. For example, the thickness is preferably not more than 400 µm and more preferably not more than 300 µm. The lower limit of the thickness of the dielectric substrates 1, 51 is not particularly limited, and the dielectric substrates 1, 51 only need to have a strength to withstand the production process and the like.

The reflective conductive plate 65 is disposed so as to oppose the slot substrate 201 with an air layer 54 therebetween. That is, the reflective conductive plate 65 is disposed so as to oppose a second main surface of the dielectric substrate (an example of a second dielectric substrate) 51 of the slot substrate 201 with the air layer (dielectric material layer) 54 therebetween. In another embodiment, instead of the air layer 54, a layer formed from a dielectric material (for example, a fluorine resin such as PTFE) having a small dielectric constant M with respect to microwaves may be used. In the scanned antenna 1000 of the present embodiment, the slot electrode 55, the reflective conductive plate 65, and the dielectric substrate 51 and the air layer 54 therebetween function as a waveguide 301.

The patch electrode 15, a portion of the slot electrode 55 which includes the slot 57 (which may be hereafter referred to as a "slot electrode unit 57U"), and the liquid crystal layer LC therebetween configure an antenna unit U. In each antenna unit U, one island-like patch electrode 15 is disposed so as to oppose one hole-like slot 57 (slot electrode unit 57U) with the liquid crystal layer LC therebetween, configuring a respective liquid crystal capacitance. In the scanned antenna 1000 of the present embodiment, the antenna units U are concentrically arrayed. The antenna units U are provided with an auxiliary capacity electrically connected in parallel with the liquid crystal capacitance.

The slot electrode 55 configures the antenna unit U in each slot electrode unit 57U, and also functions as a wall of the waveguide 301. Thus, the slot electrode 55 requires a function to suppress the transmission of microwaves, and is therefore configured from a relatively thick metal layer. Examples of the metal layer include a Cu layer and an Al layer. For example, in order to reduce microwaves of 10 GHz to 1/150, the thickness of a Cu layer would be set to not less than 3.3 µm, and the thickness of an Al layer would be set to not less than 4.0 µm. In order to reduce microwaves of 30 GHz to 1/150, the thickness of a Cu layer would be set to not less than 1.9 µm, and the thickness of an Al layer would be set to not less than 2.3 µm. The upper limit of the thickness of the metal layer of which the slot electrode 55 is configured is not particularly limited. In consideration of the formation of the alignment film OM2, it may be said that the thinner metal layer is, the better. Using a Cu layer as the metal layer provides the advantage that the metal layer can be made thinner than with an Al layer. The slot electrode 55 may be formed by a thin film deposition method as used in the conventional liquid crystal display device technology, or by other methods, such as by affixing a metal foil (for example, a Cu foil or an Al foil) onto a substrate. Thickness of the metal layer is set to not less than 2 µm and not more than 30 µm, for example. When the metal layer is formed by a thin film deposition method, the thickness of the metal layer is set to not more than 5 µm, for example. As the reflective conductive plate 65, an aluminum plate, a copper plate or the like having a thickness of the order of several millimeters may be used, for example.

The patch electrode 15 does not configure the waveguide 301 as does the slot electrode 55. Thus, the patch electrode 15 is configured of a metal layer having a thickness smaller than that of the slot electrode 55. In order to prevent the loss of conversion into heat when the oscillation of free electrons in the vicinity of the slots 57 of the slot electrode 55 induces the oscillation of free electrons in the patch electrode 15, lower resistance is preferable. From the viewpoint of mass productivity and the like, it is preferable to use an Al layer rather than a Cu layer, where the thickness of the Al layer is preferably not less than 0.5 µm and not more than 2 µm.

As described in Patent Document 1, the array pitch of the antenna units U is set to not more than $\lambda/4$ and/or not more than $\lambda/5$, where $\lambda$ is the wavelength of microwaves, for example. The wavelength $\lambda$ is 25 mm, for example, in which case the array pitch is set to not more than 6.25 mm and/or not more than 5 mm, for example.

In the scanned antenna 1000, the capacitance value of the liquid crystal capacitance of the antenna units U is varied to vary the phase of the microwaves excited (reradiated) from each patch electrode 15. Thus, the liquid crystal layer LC preferably has a large anisotropy ($\Delta\varepsilon M$) in the dielectric constant M ($\varepsilon M$) with respect to microwaves, and a small tan$\delta M$ (dielectric tangent with respect to microwaves). For example, as described by M. Wittek et al., in SID 2015 DIGEST, pp. 824-826, $\Delta\varepsilon M$ of 4 or more and tan$\delta M$ of 0.02 or less (both values at 19 GHz) may preferably be used. It is also possible to use a liquid crystal material with $\Delta\varepsilon M$ of 0.4 or more and tan$\delta M$ of 0.04 or less, as described by Kuki in Polymers, Vol. 55, Aug., pp. 599-602 (2006).

While the dielectric constant of a liquid crystal material generally has a frequency dispersion, the dielectric anisotropy $\Delta\varepsilon M$ with respect to microwaves is positively correlated with the refractive index anisotropy $\Delta n$ with respect to visible light. Accordingly, it may be said that the liquid crystal material for an antenna unit with respect to microwaves should preferably have a large refractive index anisotropy $\Delta n$ with respect to visible light. When $\Delta n$ (birefringence index) with respect to light of 550 nm is used as an index, a nematic liquid crystal having $\Delta n$ of not less than 0.3 and preferably not less than 0.4 is used for an antenna unit with respect to microwaves. The upper limit of $\Delta n$ is not particularly limited. The thickness of the liquid crystal layer LC is set to not less than 1 µm and not more than 500 µm, for example.

Figure 3:
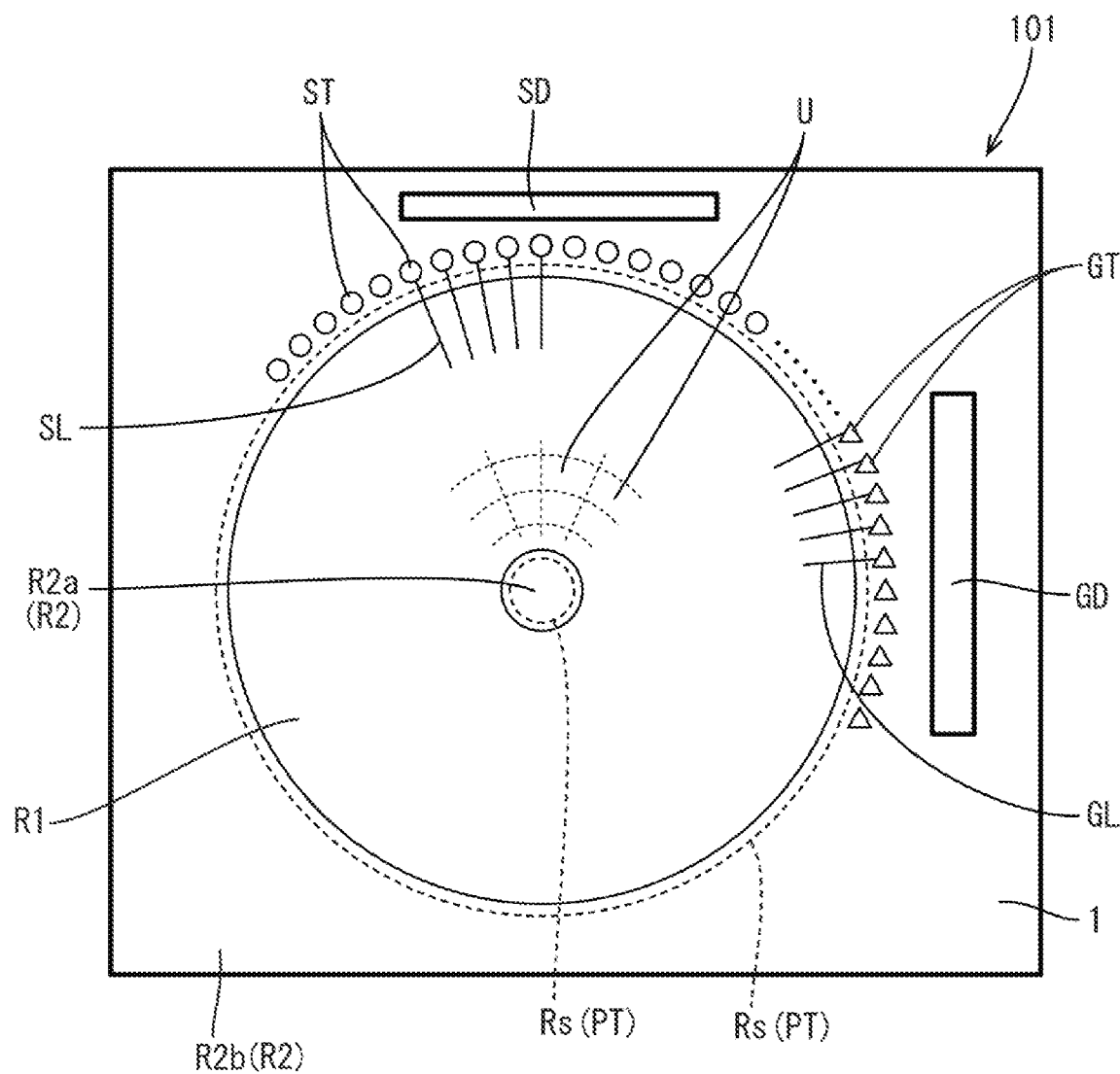
FIG. 3 is a plan view schematically illustrating a TFT substrate of the scanned antenna.
Figure 4:
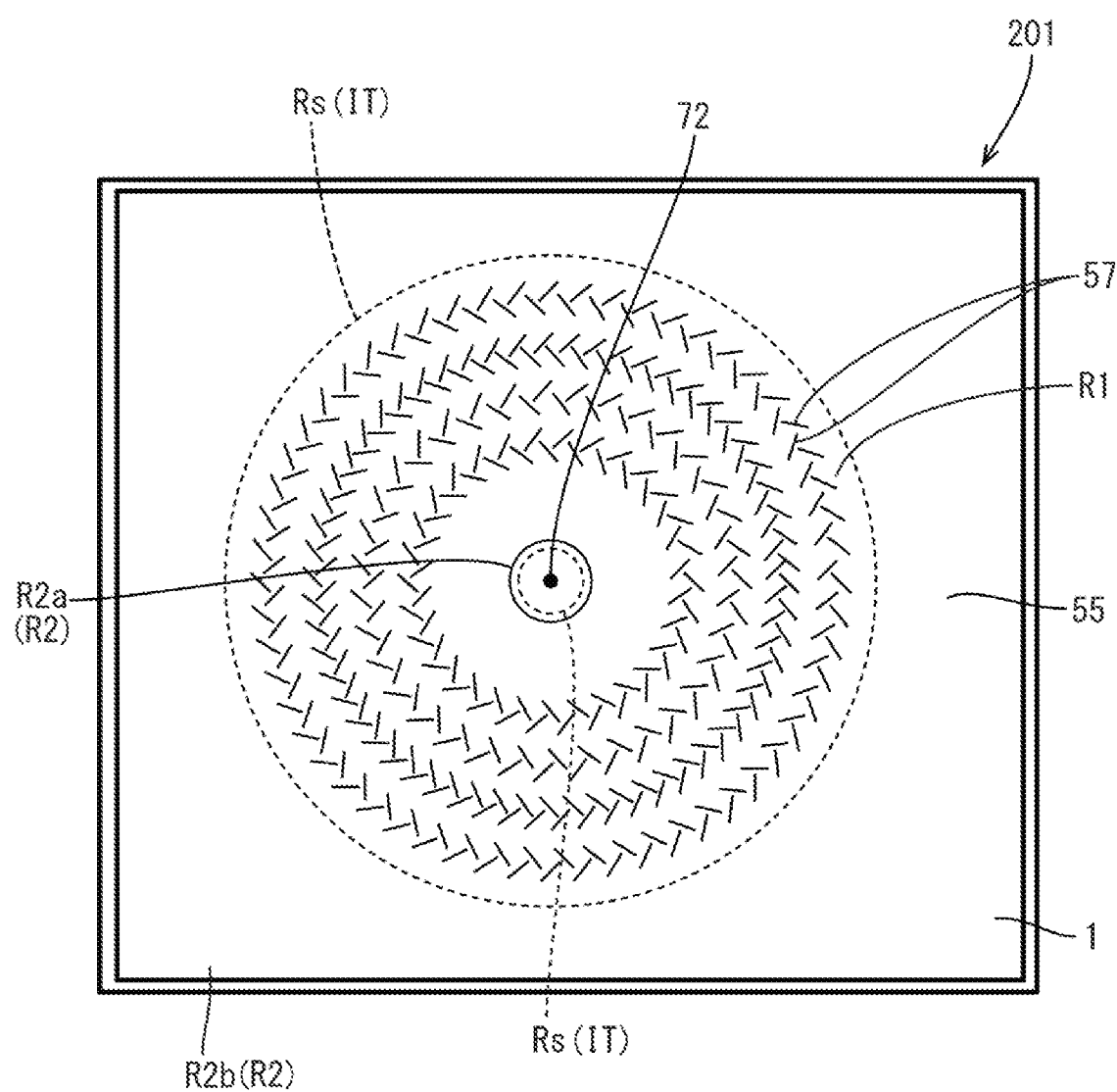
FIG. 4 is a plan view schematically illustrating a slot substrate of the scanned antenna.

FIG. 3 is a plan view schematically illustrating the TFT substrate 101 of the scanned antenna 1000. FIG. 4 is a plan view schematically illustrating the slot substrate 201 of the scanned antenna 1000. The region of the TFT substrate 101 and the region of the slot substrate 201 which correspond to the antenna unit U will be both referred to as an "antenna unit region" for ease of description, and both will be designated with the same reference symbol as that of the antenna unit. As illustrated in FIG. 3 and FIG. 4, in the TFT substrate 101 and the slot substrate 201, a region defined by the two-dimensionally arrayed antenna unit regions U will be referred to as a "transmission/reception region R1", and the regions other than the transmission/reception region R1 will be referred to as a "non-transmission/reception region R2". In the non-transmission/reception region R2, terminal portions, a drive circuit and the like are disposed.

The transmission/reception region R1 when viewed in plan has a circular-ring shape. The non-transmission/reception region R2 includes a first non-transmission/reception region R2a positioned at the center of the transmission/reception region R1, and a second non-transmission/reception region R2b disposed at the periphery of the transmission/reception region R1. The outer diameter of the transmission/reception region R1 is not less than 200 mm and not more than 1500 mm, for example, and is set, as appropriate, in accordance with the amount of communication and the like.

In the transmission/reception region R1 of the TFT substrate 101, gate bus lines GL and source bus lines SL supported on the dielectric substrate 1 are disposed, and driving of each antenna unit region U is controlled by utilizing these wires. Each antenna unit region U includes the TFT 10 and the patch electrode 15 electrically connected to the TFT 10. The source electrode of the TFT 10 is electrically connected to the source bus lines SL, and the gate electrode thereof is electrically connected to the gate bus lines GL. The drain electrode of the TFT 10 is electrically connected to the patch electrode 15.

In the non-transmission/reception region R2 (first non-transmission/reception region R2a, second non-transmission/reception region R2b), a seal region Rs is disposed in which a seal material (not illustrated) is formed so as to surround the transmission/reception region R1. The seal material has the function of, for example, adhering the TFT substrate 101 and the slot substrate 201 to each other, and sealing the liquid crystal material (liquid crystal layer LC) between the substrates 101, 201. The details of the seal material will be described later.

In the non-transmission/reception region R2, on the outside of the seal region Rs, gate terminal portions GT, a gate driver GD, source terminal portions ST, and a source driver SD are disposed. The gate bus lines GL are connected to the gate driver GD via the gate terminal portions GT. The source bus lines SL are connected to the source driver SD via the source terminal portions ST. In the present embodiment, the source driver SD and the gate driver GD are both formed on the dielectric substrate 1 of the TFT substrate 101. However, one or both of the drivers may be formed on the dielectric substrate 51 of the slot substrate 201.

In the non-transmission/reception region R2, transfer terminal portions PT are disposed. The transfer terminal portions PT are electrically connected to the slot electrode 55 of the slot substrate 201. In the present embodiment, the transfer terminal portions PT are disposed in both the first non-transmission/reception region R2a and the second non-transmission/reception region R2b. In another embodiment, the transfer terminal portions PT may be disposed in only one of the regions. In the present embodiment, the transfer terminal portions PT are disposed in the seal region Rs. Accordingly, as the seal material, a conductive resin that contains conductive particles (conductive beads) is used.

As illustrated in FIG. 4, in the slot substrate 201, the slot electrode 55 is formed across the transmission/reception region R1 and the non-transmission/reception region R2 on the dielectric substrate 51. FIG. 4 illustrates the surface of the slot substrate 201 as viewed from the liquid crystal layer LC side, where, for ease of description, the alignment film OM2 formed on the outermost surface is removed.

In the transmission/reception region R1 of the slot substrate 201, the slot electrode 55 has the slots 57. The slots 57 are respectively allocated to each antenna unit region U of the TFT substrate 101. In the present embodiment, pairs of slots 57 extending in mutually generally orthogonal directions are concentrically arranged so as to configure a radial inline slot antenna. With the pairs of slots 57, it is possible for the scanned antenna 1000 to transmit and receive circularly polarized waves.

In the non-transmission/reception region R2 of the slot substrate 201, terminal portions IT of the slot electrode 55 are disposed. The terminal portions IT are electrically connected to the transfer terminal portions PT of the TFT substrate 101. In the present embodiment, the terminal portions IT are disposed in the seal region Rs, and are electrically connected to the corresponding transfer terminal portions PT by the seal material made from the conductive resin including conductive particles (conductive beads), as mentioned above.

In the first non-transmission/reception region R2a, the feed pin 72 is disposed at the center of the concentric circles formed by the slots 57. The feed pin 72 supplies microwaves to the waveguide 301 configured from the slot electrode 55, the reflective conductive plate 65, and the dielectric substrate 51. The feed pin 72 is connected to the feed device 70. The feeding may be performed by either a directly coupled feed system or an electromagnetic coupling system, and may adopt a known feed structure.

In the following, the TFT substrate 101, the slot substrate 201, and the waveguide 301 will be described in detail.

(Structure of TFT Substrate 101)

Figure 5:
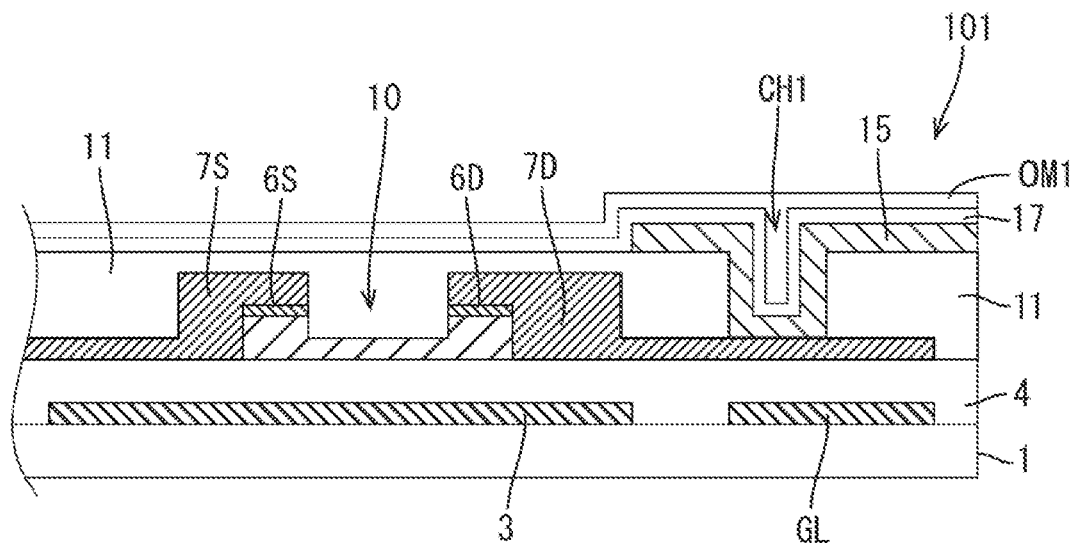
FIG. 5 is a cross-sectional view schematically illustrating an antenna unit region of the TFT substrate.
Figure 6:
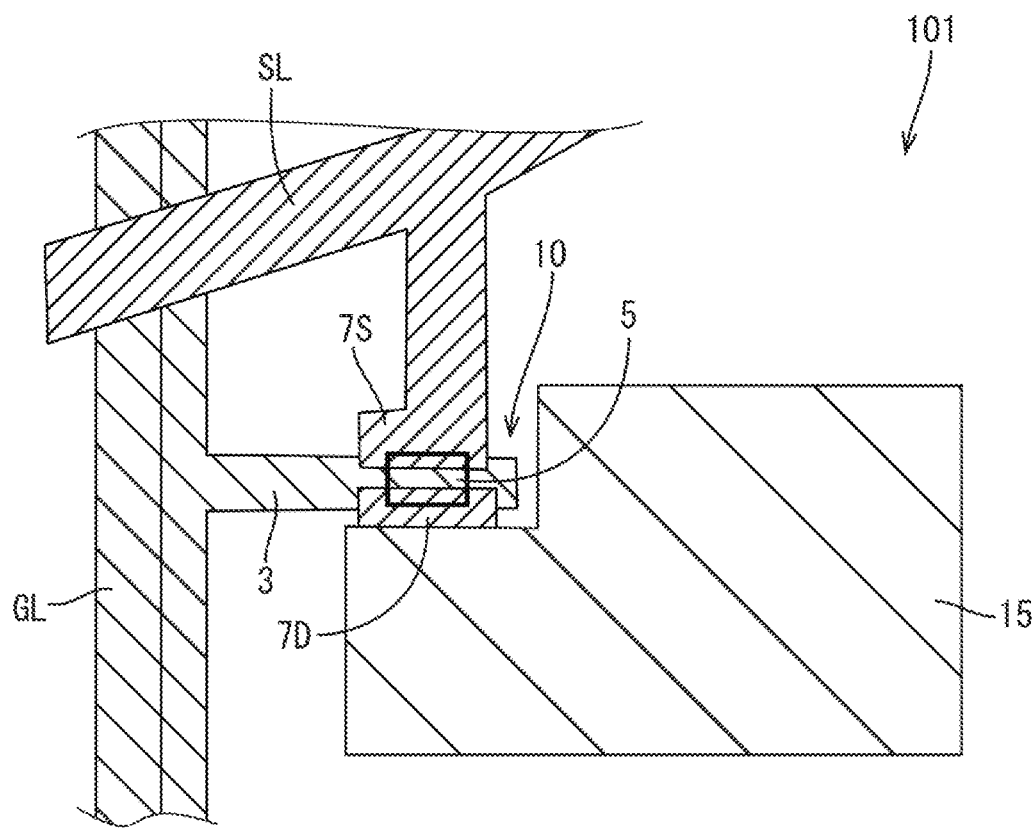
FIG. 6 is a plan view schematically illustrating the antenna unit region of the TFT substrate.

FIG. 5 is a cross-sectional view schematically illustrating the antenna unit region U of the TFT substrate 101. FIG. 6 is a plan view schematically illustrating the antenna unit region U of the TFT substrate 101. FIG. 5 and FIG. 6 each illustrate the cross-sectional configuration of a part of the transmission/reception region R1.

Each antenna unit region U of the TFT substrate 101 is provided with: the dielectric substrate (first dielectric substrate) 1; the TFT 10 supported on the dielectric substrate 1; the first insulating layer 11 covering the TFT 10; the patch electrode 15 formed on the first insulating layer 11 and electrically connected to the TFT 10; a second insulating layer 17 covering the patch electrode 15; and the alignment film OM1 covering the second insulating layer 17.

The TFT 10 is provided with: a gate electrode 3; an island-like semiconductor layer 5; a gate insulating layer 4 disposed between the gate electrode 3 and the semiconductor layer 5; a source electrode 7S; and a drain electrode 7D. The TFT 10 of the present embodiment is of a channel-etch type having a bottom gate structure. In another embodiment, the TFT may have another structure.

The gate electrode 3 is electrically connected to the gate bus line GL, and is supplied with a scan signal from the gate bus line GL. The source electrode 7S is electrically connected to the source bus line SL, and is supplied with a data signal from the source bus line SL. The gate electrode 3 and the gate bus line GL may be formed of the same conductive film (gate conductive film). The source electrode 7S, the drain electrode 7D, and the source bus line SL may be formed of the same conductive film (source conductive film). The gate conductive film and the source conductive film are made of metal films, for example. A layer formed from a gate conductive film may be referred to as a "gate metal layer". A layer formed from a source conductive film may be referred to as a "source metal layer".

The semiconductor layer 5 is arranged so as to overlap the gate electrode 3 with the gate insulating layer 4 therebetween. As illustrated in FIG. 5, the source contact layer 6S and the drain contact layer 6D are formed on the semiconductor layer 5. The source contact layer 6S and the drain contact layer 6D are arranged so as to face the sides of a region of the semiconductor layer 5 in which the channel is formed (channel region). In the present embodiment, the semiconductor layer 5 is made of an intrinsic amorphous silicon (i-a-Si) layer, and the source contact layer 6S and the drain contact layer 6D are made of $n^+$-type amorphous silicon ($n^+$-a-Si) layer. In another embodiment, the semiconductor layer 5 may be configured from a polysilicon layer, an oxide semiconductor layer or the like.

The source electrode 7S is disposed so as to contact the source contact layer 6S, and is connected to the semiconductor layer 5 with the source contact layer 6S therebetween. The drain electrode 7D is disposed so as to contact the drain contact layer 6D, and is connected to the semiconductor layer 5 with the drain contact layer 6D therebetween.

The first insulating layer 11 is provided with a contact hole CH1 reaching the drain electrode 7D of the TFT 10.

The patch electrode 15 is disposed on the first insulating layer 11 and in the contact hole CH1, and is in contact with the drain electrode 7D in the contact hole CH1. The patch electrode 15 is mainly configured from a metal layer. The patch electrode 15 may be a metal electrode formed only from a metal layer. The material of the patch electrode 15 may be the same as that of the source electrode 7S and the drain electrode 7D. The thickness of the metal layer of the patch electrode 15 (or, when the patch electrode 15 is a metal electrode, the thickness of the patch electrode 15) may be the same as, or, preferably, greater than, the thickness of the source electrode 7S and the drain electrode 7D. When the thickness of the patch electrode 15 is large, the transmittance of electromagnetic waves can be kept low, whereby the sheet resistance of the patch electrode is reduced and the loss of conversion of the oscillation of free electrons in the patch electrode into heat can be reduced.

A CS bus line CL may be provided using the same conductive film as that of the gate bus line GL. The CS bus line CL may be arranged so as to overlap the drain electrode 7D (or an extension of the drain electrode 7D) with the gate insulating layer 4 therebetween, and may configure an auxiliary capacity CS using the gate insulating layer 4 as a dielectric material layer.

In the present embodiment, the patch electrode 15 is formed in a layer different from the source metal layer. Accordingly, the thickness of the source metal layer and the thickness of the patch electrode 15 can be controlled independently of each other.

The patch electrode 15 may include a Cu layer or an Al layer as a main layer. The performance of a scanned antenna is correlated with the electric resistance of the patch electrode 15, and the thickness of the main layer is set such that a desired resistance can be obtained. Preferably, the resistance of the patch electrode 15 is decreased to the extent that the oscillation of electrons would not be hindered. The thickness of the metal layer of the patch electrode 15, when formed of an Al layer, for example, is set to not less than 0.5 µm.

The alignment film OM1 is made of a polyimide-based resin. The details of the alignment film OM1 will be described later.

The TFT substrate 101 is produced by the following method, for example. First, the dielectric substrate 1 is prepared. As the dielectric substrate 1, a glass substrate, a heat-resistant plastic substrate or the like may be used, for example. On the dielectric substrate 1, a gate metal layer including the gate electrode 3 and the gate bus lines GL is formed.

The gate electrode 3 may be formed integrally with the gate bus lines GL. Herein, on the dielectric substrate 1, a gate conductive film (thickness: 50 nm to 500 nm inclusive) is formed by sputtering, for example. The gate conductive film is then patterned to form the gate electrode 3 and the gate bus lines GL. The material of the gate conductive film is not particularly limited. For example, it is possible to use a film including a metal, such as aluminum (Al), tungsten (W), molybdenum (Mo), tantalum (Ta), chromium (Cr), titanium (Ti), or copper (Cu), an alloy thereof, or a metal nitride thereof, as appropriate. Herein, as the gate conductive film, a layered film in which MoN (thickness: 50 nm, for example), Al (thickness: 200 nm, for example), and MoN (thickness: 50 nm, for example) are layered in this order is formed.

Then, the gate insulating layer 4 is formed so as to cover the gate metal layer. The gate insulating layer 4 may be formed by a CVD method, for example. As the gate insulating layer 4, it is possible to use, as appropriate, a silicon oxide ($SiO_2$) layer, a silicon nitride (SiNx) layer, a silicon oxide nitride (SiOxNy; x>y) layer, or a silicon nitride oxide (SiNxOy; x>y) layer, for example. The gate insulating layer 4 may have a layered structure. Herein, as the gate insulating layer 4, a SiNx layer (thickness: 410 nm, for example) is formed.

Then, on the gate insulating layer 4, the semiconductor layer 5 and a contact layer are formed. Herein, an intrinsic amorphous silicon film (thickness: 125 nm, for example) and an $n^+$-type amorphous silicon film (thickness: 65 nm, for example) are formed in this order and then patterned to obtain the island-like semiconductor layer 5 and a contact layer. The semiconductor film used for the semiconductor layer 5 is not limited to an amorphous silicon film. For example, as the semiconductor layer 5, an oxide semiconductor layer may be formed. In this case, a contact layer may not be disposed between the semiconductor layer 5 and the source/drain electrodes.

Then, a source conductive film (thickness: 50 nm to 500 nm inclusive, for example) is formed on the gate insulating layer 4 and the contact layer and then patterned, forming a source metal layer including the source electrode 7S, the drain electrode 7D, and the source bus line SL. At this time, the contact layer is also etched, whereby the source contact layer 6S and the drain contact layer 6D separated from each other are formed.

The material of the source conductive film is not particularly limited. For example, it is possible to use, as appropriate, a film including a metal, such as aluminum (Al), tungsten (W), molybdenum (Mo), tantalum (Ta), chromium (Cr), titanium (Ti), or copper (Cu), an alloy thereof, or a metal nitride thereof. Herein, as the source conductive film, a layered film in which MoN (thickness: 30 nm, for example), Al (thickness: 200 nm, for example), and MoN (thickness: 50 nm, for example) are layered in this order is formed.

Herein, for example, the source conductive film is formed by sputtering, and then pattering of the source conductive film (source/drain separation) is performed by wet etching. Thereafter, dry etching is performed, for example, to remove a portion of the contact layer which is positioned over the region for the channel region of the semiconductor layer 5, whereby the gap portion is formed, and the contact layer is separated into the source contact layer 6S and the drain contact layer 6D. At this time, in the gap portion, the vicinity of the surface of the semiconductor layer 5 is also etched (over-etching).

Next, the first insulating layer 11 is formed so as to cover the TFTs 10. In the present example, the first insulating layer 11 is arranged so as to contact the channel region of the semiconductor layer 5. Also, by a known photolithography technique, the contact hole CH1 reaching the drain electrode 7D is formed in the first insulating layer 11.

The first insulating layer 11 may be an inorganic insulating layer of a silicon oxide ($SiO_2$) film, a silicon nitride (SiNx) film, a silicon oxide nitride (SiOxNy; x>y) film, a silicon nitride oxide (SiNxOy; x>y) film or the like. Herein, as the first insulating layer 11, a SiNx layer having a thickness of 330 nm is formed by a CVD method, for example.

Then, a patch conductive film is formed on the first insulating layer 11 and in the contact hole CH1 and patterned. Thereby, the patch electrode 15 is formed in the transmission/reception region R1. In the non-transmission/reception region R2, a patch connection portion made of the same conductive film (patch conductive film) as that of the patch electrode 15 is formed. The patch electrode 15 contacts the drain electrode 7D in the contact hole CH1.

As the material of the patch conductive film, a material similar to that of the gate conductive film or the source conductive film may be used. Preferably, however, the patch conductive film is set to be thicker than the gate conductive film and the source conductive film. Preferably, the thickness of the patch conductive film is 1 μm to 30 μm inclusive, for example. If the thickness is smaller, the transmittance of electromagnetic waves would be of the order of 30% and the sheet resistance would become 0.03 Ω/sq or more, potentially resulting in the problem of a large loss. If the thickness is greater, the problem of degradation of patternability with respect to the slots 57 may potentially arise.

Herein, as the patch conductive film, a layered film (MoN/Al/MoN) in which MoN (thickness: 50 nm, for example), Al (thickness: 1000 nm, for example), and MoN (thickness: 50 nm, for example) are layered in this order is formed.

Then, the second insulating layer (thickness: 100 nm to 300 nm inclusive, for example) 17 is formed on the patch electrode 15 and the first insulating layer 11. The second insulating layer 17 is not particularly limited. For example, it is possible to use, as appropriate, a silicon oxide ($SiO_2$) film, a silicon nitride (SiNx) film, a silicon oxide nitride (SiOxNy; x>y) film, or a silicon nitride oxide (SiNxOy; x>y) film. Herein, as the second insulating layer 17, a SiNx layer having a thickness of 200 nm is formed, for example.

Thereafter, the inorganic insulating films (the second insulating layer 17, the first insulating layer 11, and the gate insulating layer 4) are etched collectively by dry etching using a fluorine gas, for example. During the etching, the patch electrode 15, the source bus lines SL, and the gate bus lines GL function as an etch stop. In this way, a second contact hole reaching the gate bus lines GL is formed in the second insulating layer 17, the first insulating layer 11, and the gate insulating layer 4, and a third contact hole reaching the source bus lines SL is formed in the second insulating layer 17 and the first insulating layer 11. Also, a fourth contact hole reaching the patch connection portion is formed in the second insulating layer 17.

Next, a conductive film (thickness: 50 nm to 200 nm inclusive) is formed on the second insulating layer 17 and in the second contact hole, the third contact hole, and the fourth contact hole by sputtering, for example. As the conductive film, a transparent conductive film, such as an indium tin oxide (ITO) film, an IZO film, or a ZnO film (zinc oxide film), may be used. Herein, as the conductive film, an ITO film having a thickness of 100 nm is used, for example.

Then, the transparent conductive film is patterned to form a gate terminal upper connection portion, a source terminal upper connection portion, and a transfer terminal upper connection portion. The gate terminal upper connection portion, the source terminal upper connection portion, and the transfer terminal upper connection portion are used for protecting electrodes or wires exposed in each terminal portion. In this way, the gate terminal portions GT, the source terminal portions ST, and the transfer terminal portions PT are obtained.

Then, the alignment film OM1 is formed so as to cover the second insulating layer 17 and the like. The details of the alignment film OM1 will be described later. In this way, the TFT substrate 101 can be produced.

(Structure of Slot Substrate 201)

Figure 7:
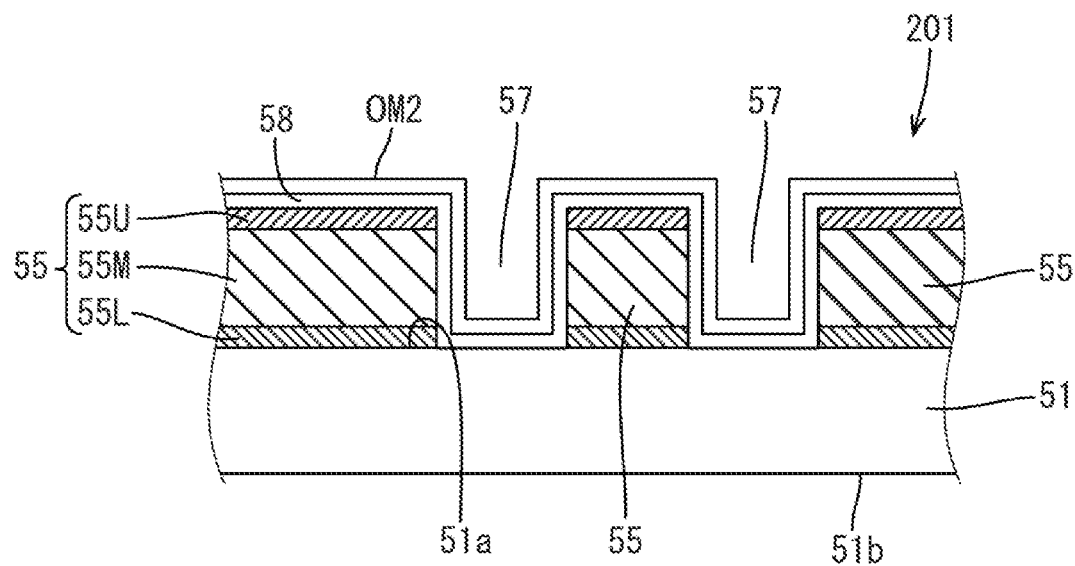
FIG. 7 is a cross-sectional view schematically illustrating an antenna unit region of a slot substrate.

The structure of the slot substrate 201 will be described more concretely. FIG. 7 is a cross-sectional view schematically illustrating the antenna unit region U of the slot substrate 201.

The slot substrate 201 is mainly provided with: the dielectric substrate (second dielectric substrate) 51; the slot electrode 55 formed on one plate surface (the plate surface facing the liquid crystal layer side; the plate surface facing the TFT substrate 101 side) 51a of the dielectric substrate 51; a third insulating layer 58 covering the slot electrode 55; and the alignment film OM2 covering the third insulating layer 58.

In the transmission/reception region R1 of the slot substrate 201, the slot electrode 55 is formed with the slots 57 (see FIG. 3). The slots 57 are openings (groove portions) penetrating through the slot electrode 55. In the present example, one slot 57 is allocated to each antenna unit region U.

The slot electrode 55 includes a main layer 55M, such as a Cu layer or an Al layer. The slot electrode 55 may have a layered structure in which the main layer 55M is sandwiched between an upper layer 55U and a lower layer 55L. The thickness of the main layer 55M is set in consideration of the skin effect depending on the material, and may be 2 µm to 30 µm inclusive. The thickness of the main layer 55M is typically set greater than the thickness of the upper layer 55U and the lower layer 55L.

In the present example, the main layer 55M is made of a Cu layer, and the upper layer 55U and the lower layer 55L are each made of a Ti layer. The lower layer 55L is arranged between the main layer 55M and the dielectric substrate 51, whereby the adhesion between the slot electrode 55 and the dielectric substrate 51 is improved. The upper layer 55U is provided to suppress corrosion of the main layer 55M (for example, a Cu layer).

The third insulating layer 58 is formed on the slot electrode 55 and in the slots 57. The material of the third insulating layer 52 is not particularly limited. For example, it is possible to use, as appropriate, a silicon oxide ($SiO_2$) film, a silicon nitride ($SiN_x$) film, a silicon oxide nitride ($SiO_xN_y$; x>y) film, or a silicon nitride oxide ($SiN_xO_y$; x>y) film.

The alignment film OM2 is made of polyimide-based resin, similarly to the alignment film OM1 of the TFT substrate 101. The details of the alignment film OM2 will be described later.

In the non-transmission/reception region R2 of the slot substrate 201, the terminal portions IT are disposed (see FIG. 4). The terminal portions IT are provided with a part of the slot electrode 55, the third insulating layer 58 covering a part of the slot electrode 55, and an upper connection portion. The third insulating layer 58 includes an opening (contact hole) reaching a part of the slot electrode 55. The upper connection portion is in contact with a part of the slot electrode 55 in the opening. In the present embodiment, the terminal portions IT are made of a conductive layer of an ITO film, an IZO film or the like, and are arranged in the seal region Rs. The terminal portions IT are connected to the transfer terminal portions PT of the TFT substrate 101 by a seal resin containing conductive particles (for example, conductive beads such as Au beads).

The slot substrate 201 is produced by the following method, for example. First, the dielectric substrate 51 is prepared. As the dielectric substrate 51, it is possible to use a substrate having high transmittance (i.e., small dielectric constant εM and small dielectric loss tan δM) with respect to electromagnetic waves, such as a glass substrate or a resin substrate. Preferably, the dielectric substrate 51 has a small thickness in order to suppress attenuation of electromagnetic waves. For example, constituent elements such as the slot electrode 55 are formed on a surface of the glass substrate by a process as will be described later, and then the glass substrate may be thinned from the back-surface side. Thereby, the thickness of the glass substrate can be set to not more than 500 µm, for example. Generally, resins have smaller dielectric constant εM and dielectric loss tan δM than glass. When the dielectric substrate 51 is made of a resin substrate, its thickness is 3 µm to 300 µm inclusive, for example. As the material of the resin base material, polyimide or the like is used.

A metal film is formed on the dielectric substrate 51 and patterned to obtain the slot electrode 55 having the slots 57. As the metal film, a Cu film (or an Al film) having a thickness of 2 µm to 5 µm inclusive may be used. Herein, a layered film in which a Ti film, a Cu film, and a Ti film are layered in this order is used.

Then, the third insulating layer (thickness: 100 nm to 200 nm inclusive) 58 is formed on the slot electrode 55 and in the slots 57. The third insulating layer 52 herein is made of a silicon oxide ($SiO_2$) film.

Thereafter, in the non-transmission/reception region R2, an opening (contact hole) reaching a part of the slot electrode 55 is formed in the third insulating layer 58.

Then, a transparent conductive film is formed on the third insulating layer 58 and in the opening of the third insulating layer 58. The transparent conductive film is then patterned to form an upper connection portion which contacts a part of the slot electrode 55 in the opening. Thus, the terminal portions IT for connection with the transfer terminal portions PT of the TFT substrate 101 is obtained.

Thereafter, the alignment film OM2 is formed so as to cover the third insulating layer 58. The details of the alignment film OM2 will be described later. In this way, the slot substrate 201 can be produced.

(Configuration of Waveguide 301)

The waveguide 301 is configured such that the reflective conductive plate 65 opposes the slot electrode 55 with the dielectric substrate 51 therebetween. The reflective conductive plate 65 is disposed so as to oppose the back surface of the dielectric substrate 51 with the air layer 54 therebetween. The reflective conductive plate 65 configures a wall of the waveguide 301, and therefore preferably has a thickness which is not less than three times, and preferably not less than five times, the skin depth. As the reflective conductive plate 65, it is possible to use an aluminum plate, a copper plate or the like fabricated by machining and having a thickness of the order of several millimeters, for example.

For example, when the scanned antenna 1000 emits a signal, the waveguide 301 guides the microwaves supplied from the feed pin 72, disposed at the center of the concentrically arrayed antenna units U, outward in a radially expanding manner. The microwaves as they move through the waveguide 301 are cut by the slots 57 in each antenna unit U, whereby an electric field is generated by the principle of a so-called slot antenna. The electric field causes charges to be induced in the slot electrode 55 (that is, the microwaves are converted into the oscillation of free electrons in the slot electrode 55). In each antenna unit U, by varying the capacitance value of the liquid crystal capacitance via liquid crystal alignment control, the phase of the oscillation of free electrons induced in the patch electrode 15 can be controlled. When charges are induced in the patch electrode 15, an electric field is generated (i.e., the oscillation of free electrons in the slot electrode 55 is transferred to the oscillation of free electrons in the patch electrode 15), and microwaves (radio waves) are oscillated from the patch electrode 15 of each antenna unit U toward the outside of the TFT substrate 101. The microwaves (radio waves) having different phases that have been oscillated from each antenna unit U are summed, whereby the azimuth angle of the beam is controlled.

In another embodiment, a two-layer structure may be adopted in which the waveguide has an upper layer and a lower layer. In this case, the microwaves supplied from the feed pin initially travel in the lower layer outward from the center in a radially expanding manner. Thereafter, the microwaves rise at the outer-wall portion of the lower layer up to the upper layer, and then travel in the upper layer to gather at the center from the outer side. With the two-layer structure, it becomes easier to cause the microwaves to reach each antenna unit U uniformly.

(Alignment Film OM (OM1, OM2))

As the alignment films OM1, OM2 (which may be hereafter collectively referred to as an "alignment film OM") utilized in the TFT substrate 101 and the slot substrate 201 of the present embodiment, a film obtained by, for example, imidizing the polyamic acid expressed by the following chemical formula (4) as expressed by the following chemical formula (5), and then subjecting the result of imidization to an alignment process, such as rubbing. The alignment process causes the alignment film OM to express the function for aligning a liquid crystal compound in a predetermined direction.

[C 8]

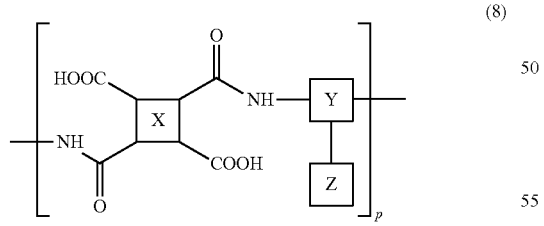

(8)

[C 9]

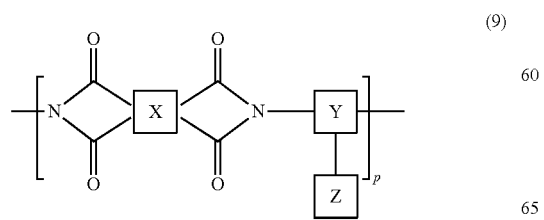

(9)

In chemical formula (8) and chemical formula (9), p is an arbitrary natural number. In chemical formula (8) and chemical formula (9), X has a structure represented by the following chemical formula (10-1) to chemical formula (10-16).

[C 10]

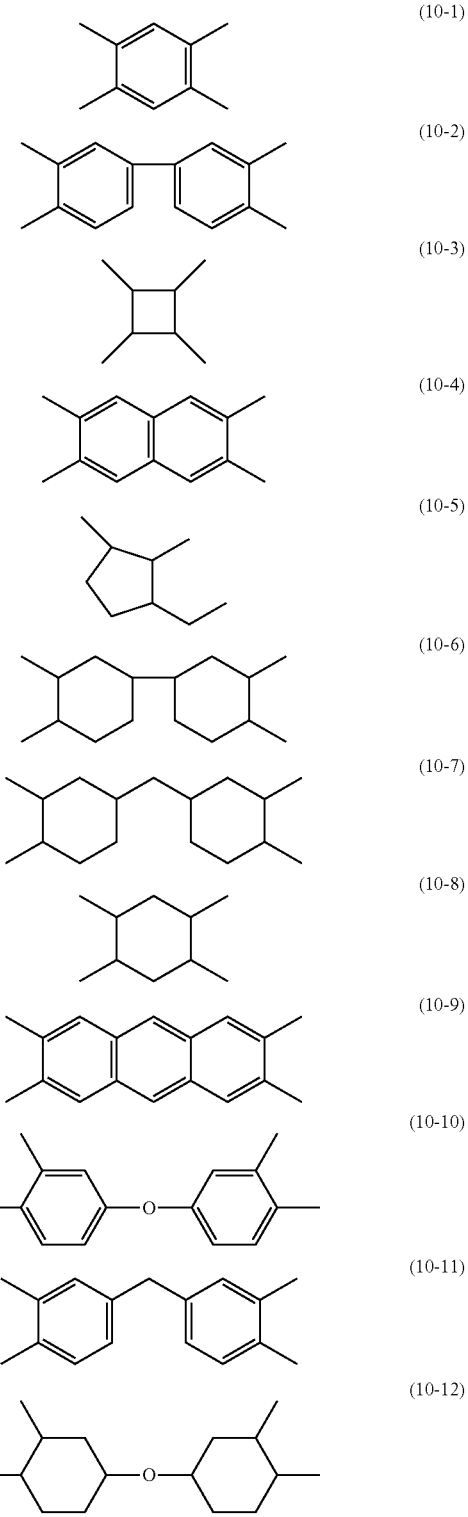

-continued
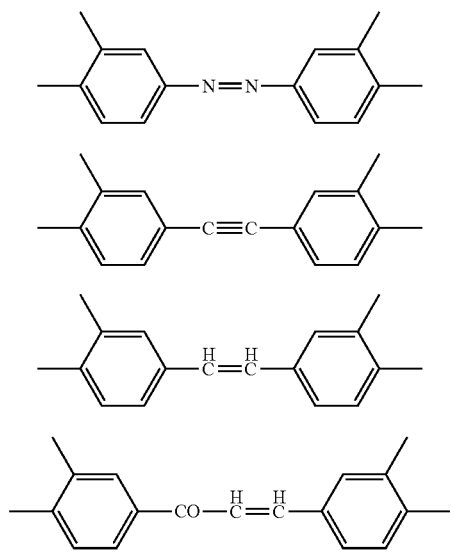
(10-13)
(10-14)
(10-15)
(10-16)
In chemical formula (8) and chemical formula (9), Y has a structure represented by the following chemical formula (11-1) to chemical formula (11-24).
[C 11]
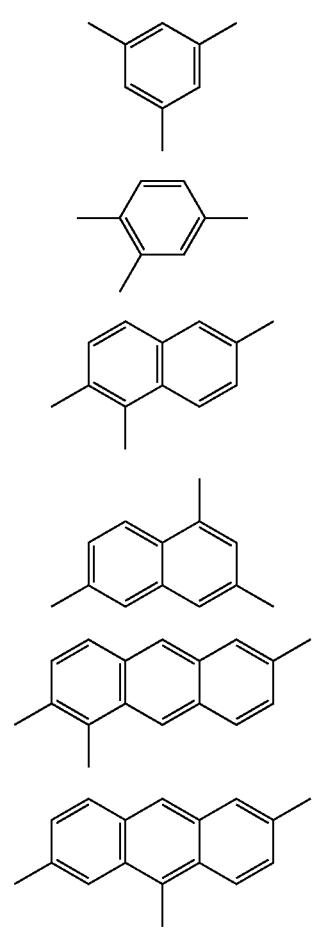
(11-1)
(11-2)
(11-3)
(11-4)
(11-5)
(11-6)
-continued
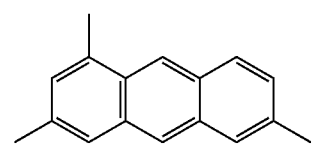
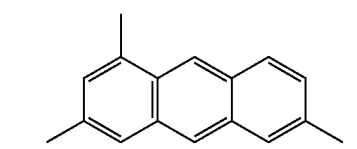
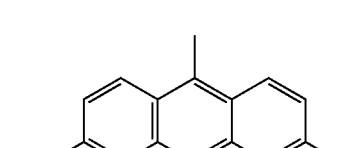
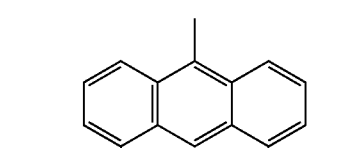
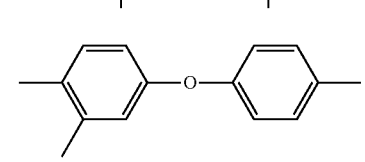
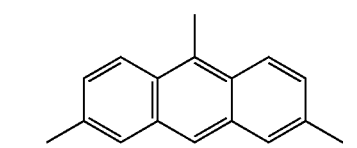
(11-7)
(11-8)
(11-9)
(11-10)
(11-11)
(11-12)
(11-13)
(11-14)
(11-15)
(11-16)
(11-17)

-continued

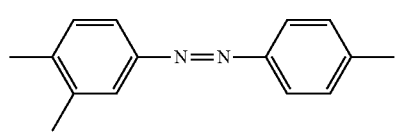
(11-18)

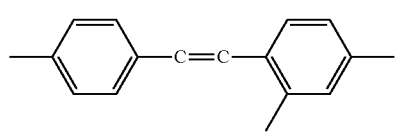
(11-19)

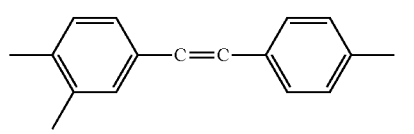
(11-20)

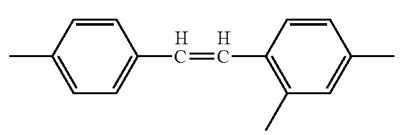
(11-21)

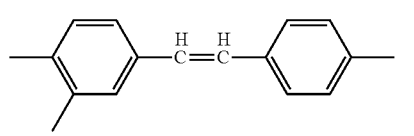
(11-22)

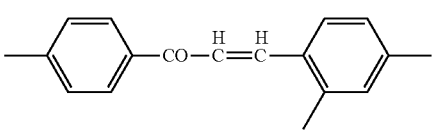
(11-23)

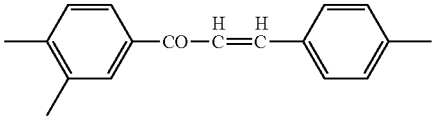
(11-24)

In chemical formula (8) and chemical formula (9), Z represents a side chain. The structure of Z is not particularly limited as long as the object of the present invention is not compromised. Z may be omitted. In chemical formula (8) and chemical formula (9), if Z is absent, the linking group of chemical formula (11-1) to chemical formula (11-24) may be at any two locations.

Imidization of the polyamic acid expressed by chemical formula (8) is performed by, for example, subjecting the polyamic acid to a heating process at high temperature (for example, 200 to 250° C.). It is also possible to use a chemical imidization method involving the use of acetic anhydride or the like as a dehydrating agent, and pyridine or the like as a catalyst, for example. The imidization ratio of the polyimide expressed by chemical formula (9) is not particularly limited, as long as the object of the present invention is not compromised. Preferably, however, the imidization ratio is not less than 50%, for example.

The alignment film OM may be a horizontal alignment film of which the alignment direction is horizontal with respect to the substrate surface, or a vertical alignment film of which the alignment direction is perpendicular to the substrate surface.

The polymerization method for the polyamic acid is not particularly limited, and a known method may be used. The polyamic acid is dissolved, as appropriate, in organic solvent and prepared as a fluid liquid or sol-like composition (aligning agent).

In the present embodiment, the alignment film OM (alignment films OM1, OM2) is formed on the surfaces of both the TFT substrate 101 and the slot substrate 201. In another embodiment, the alignment film OM may be formed on the surface of only one of the TFT substrate 101 and the slot substrate 201.

When the alignment film OM is formed, first, an uncured, fluid aligning agent containing the polyamic acid represented by chemical formula (8) is applied onto the surface of each of the substrates 101, 201, using a coater. The applied material is first subjected to provisional sintering (for example, a heating process at 80° C. for two minutes), and then subjected to main sintering (for example, a heating process at 210° C. for 10 minutes). Thereafter, the applied material after the main sintering is subjected to a rubbing process, whereby the alignment film OM having an alignment property for aligning a liquid crystal compound in a predetermined direction is obtained. The polyamic acid is imidized during the provisional sintering or the main sintering.

(Liquid Crystal Layer LC (Liquid Crystal Compound))

As the liquid crystal material (liquid crystal compound) configuring the liquid crystal layer, an isothiocyanate group-containing liquid crystal compound having a large dielectric constant anisotropy (Δε) (for example, 10 or more) is used. As the isothiocyanate group-containing liquid crystal compound, the one expressed by the following chemical formula (7-1), or chemical formula (7-2) is utilized, for example.

[C 12]

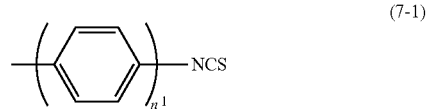
(7-1)

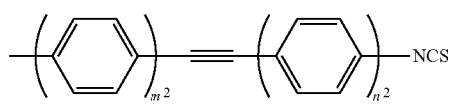
(7-2)

In chemical formula (7-1) and chemical formula (7-2), $n^1$, $m^2$, and $n^2$ are integers of 1 to 5, and the H in the phenylene group may be substituted with F or Cl.

As the liquid crystal material, a liquid crystal compound other than the isothiocyanate group-containing liquid crystal compound may be included, as long as the object of the present invention is not compromised.

(Antenna Unit U)

Figure 8:
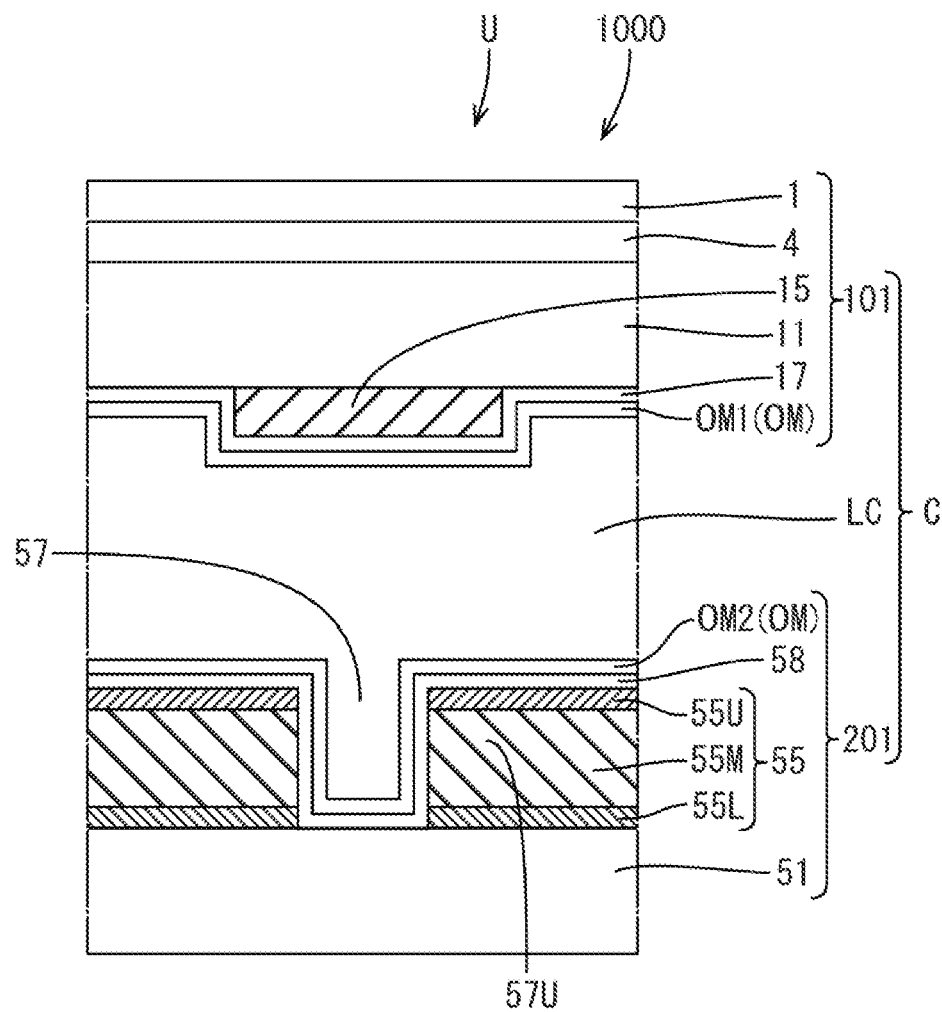
FIG. 8 is a cross-sectional view schematically illustrating the TFT substrate, a liquid crystal layer, and the slot substrate configuring an antenna unit of the scanned antenna.

FIG. 8 is a cross-sectional view schematically illustrating the TFT substrate 101, the liquid crystal layer LC, and the slot substrate 201 configuring the antenna unit U of the scanned antenna 1000. As illustrated in FIG. 8, in the antenna unit U, the island-like patch electrode 15 of the TFT substrate 101 and the hole-like (groove-like) slot 57 (slot electrode unit 57U) provided in the slot electrode 55 of the slot substrate 201 are opposed to each other with the liquid crystal layer LC sandwiched therebetween. The scanned antenna 1000 is provided with: the liquid crystal layer LC; and a liquid crystal cell C which includes a pair of the TFT substrate 101 and the slot substrate 201 sandwiching the liquid crystal layer LC and respectively having the alignment films OM1, OM2 disposed on their respective surfaces on the liquid crystal layer LC side. In the present description, the antenna unit U has the configuration including one patch electrode 15 and the slot electrode 55 (slot electrode unit 57U) in which at least one slot 57 corresponding to the patch electrode 15 is arranged.

(Seal Material)

Figure 9:
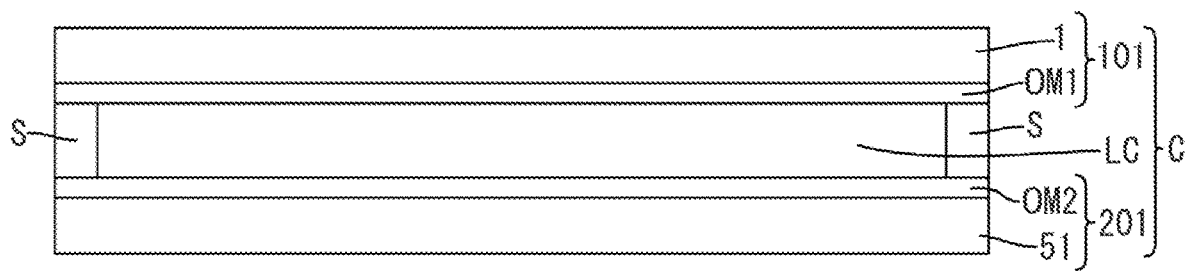
FIG. 9 is a cross-sectional view schematically illustrating the configuration of a liquid crystal cell.

FIG. 9 is a cross-sectional view schematically illustrating the configure of the liquid crystal cell C. Between the pair of substrates configuring the liquid crystal cell C, i.e., the TFT substrate 101 (an example of a first substrate) and the slot substrate 201 (an example of a second substrate), a seal material S is disposed so as to surround the liquid crystal layer LC. The seal material S has the function of adhering to the TFT substrate 101 and the slot substrate 201, and bonding the TFT substrate 101 and the slot substrate 201 to each other. The TFT substrate 101 and the slot substrate 201 form a pair of substrates facing each other and sandwiching the liquid crystal layer LC.

The seal material S is made of a cured product of a seal material composition containing a curable resin. The seal material composition mainly contains an epoxy compound, a polymerizable epoxy curing agent, a photoradical polymerization initiator, and a thermal radical polymerization initiator.

The epoxy compound is made from a monomer or resin that includes at least one (preferably two or more) epoxy group (thermally reactive functional group) in a single molecule.

The epoxy resin is not particularly limited as long as the object of the present invention is not compromised. Examples include phenol novolac-type epoxy resins, cresol novolac-type epoxy resins, biphenyl novolac-type epoxy resins, trisphenol novolac-type epoxy resins, dicyclopentadiene novolac-type epoxy resins, bisphenol A-type epoxy resins, bisphenol F-type epoxy resins, 2,2'-diallyl bisphenol A-type epoxy resins, bisphenol S-type epoxy resins, hydrogenated bisphenol A-type epoxy resins, propylene oxide-adduct bisphenol A-type epoxy resins, biphenyl-type epoxy resins, naphthalene-type epoxy resins, resorcinol-type epoxy resins, and glycidyl amines.

Among the epoxy resins, those commercially available include: as a phenyl novolac-type epoxy resin, product name "NC-3000S" (produced by Nippon Kayaku Co., Ltd.); as trisphenol novolac-type epoxy resins, product names "EPPN-501H" and "EPPN-501H" (the above produced by Nippon Kayaku Co., Ltd.); as a dicyclopentadiene novolac-type epoxy resin, product name "NC-7000L" (produced by Nippon Kayaku Co., Ltd.); as bisphenol A-type epoxy resins, product names "Epiclon 840S" and "Epiclon 850CRP" (the above produced by Dainippon Ink and Chemicals, Inc.); as bisphenol F-type epoxy resins, product name "Epikote 807" (produced by Japan Epoxy Resins Co., Ltd.) and product name "Epiclon 830" (produced by Dainippon Ink and Chemicals, Inc.); as a 2,2'-diallyl bisphenol A-type epoxy resin, product name "RE310NM" (produced by Nippon Kayaku Co., Ltd.); as a hydrogenated bisphenol type epoxy resin, product name "Epiclon 7015" (produced by Dainippon Ink and Chemicals, Inc.); as a propylene oxide-adduct bisphenol A-type epoxy resin, product name "Epoxy Ester 3002A" (produced by Kyoeisha Chemical Co., Ltd.); as biphenyl-type epoxy resins, product names "Epikote YX-4000H", "YL-6121H" (the above produced by Japan Epoxy Resins Co., Ltd.) as a naphthalene-type epoxy resin, product name "Epiclon HP-4032" (produced by Dainippon Ink and Chemicals, Inc.); as a resorcinol-type epoxy resin, product name "Denacol EX-201" (produced by Nagase ChemteX Corporation); and as glycidyl amines, product names "Epiclon 430" (produced by Dainippon Ink and Chemicals, Inc.) and "Epikote 630" (produced by Japan Epoxy Resins Co., Ltd.).

As the epoxy compound, an epoxy/(meth)acrylic resin in which at least one each of a (meth)acrylic group and an epoxy group are included in a single molecule. Examples of such epoxy/(meth)acrylic resin include: compounds obtained by causing a part of an epoxy group of the epoxy resin to react with a (meth) acrylic acid in the presence of a basic catalyst according to a routine procedure; compounds obtained by causing ½ mole of a (meth)acrylic monomer having a hydroxyl group and then ½ mole of glycidol to react with one mole of bifunctional or more isocyanate; and compounds obtained by causing glycidol to react with (meth)acrylate having an isocyanate group. An example of commercially available products of the epoxy/(meth)acrylic resin has product name "UVAC1561" (produced by Daicel UCB Co., Ltd.). In the present description, (meth)acrylic refers to acryl or methacryl.

As the epoxy compound, examples include epoxy (meth) acrylate that is derived from a compound including a glycidyl group (epoxy group) and from (meth)acrylic acid. The epoxy (meth)acrylate is not particularly limited as long as the object of the present invention is not compromised. An example is epoxy (meth)acrylate derived from an epoxy resin, such as bisphenol A-type epoxy resin or propylene glycol diglycidyl ether, and (meth)acrylic acid. Examples of commercially available products include product names "EA-1020", "EA-6320", and "EA-5520" (the above produced by Shim-Nakamura Chemical Co., Ltd.), and "Epoxy Ester 70PA" and "Epoxy Ester 3002A" (the above produced by Kyoeisha Chemical Co., Ltd.).

The polymerizable epoxy curing agent is made of a compound which is configured for cross-linking the epoxy groups included in the epoxy compound, and which includes a polymerizable functional group configured for radical polymerization in a single molecule.

Preferably, the polymerizable epoxy curing agent includes two or more hydrazide groups in a single molecule.

The polymerizable epoxy curing agent, for the purpose of increasing molecular weight to suppress elution into the liquid crystal layer, is provided with a polymerizable functional group configured for radical polymerization.

The polymerizable epoxy curing agent, by having a polar group introduced therein, is suppressed from eluting into the liquid crystal layer. Specifically, it is preferable that an amide group, a urethane group or the like be introduced.

Examples of the polymerizable epoxy curing agent include compounds expressed by chemical formulas (1-1), (1-2), and (1-3).

[C 13]

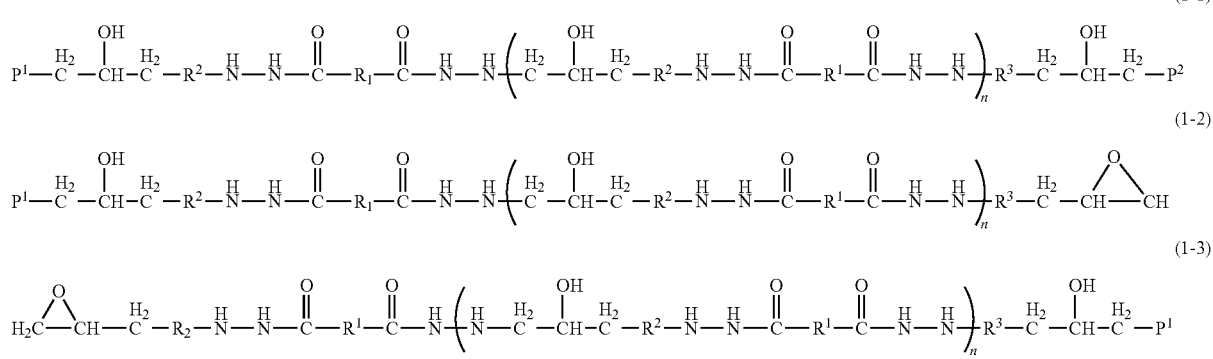

In chemical formulas (1-1), (1-2), and (1-3), n is an integer of 0 to 10, R1 is an alkylene group having 1 to 10 carbon atoms, or a group represented by the following chemical formula (2), $R^2$ is a group represented by the following chemical formula (3-1), (3-2), (3-3), (3-4), (3-5), or (3-6), $R^3$ is a group represented by the following chemical formula (4-1), (4-2), (4-3), (4-4), (4-5), or (4-6), and $P^1$ and $P^2$ are groups which are represented by the following chemical formula (5-1), (5-2), (5-3), or (5-4), and which may be the same or different from each other.

[C 14]

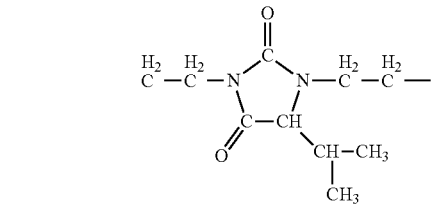

(2)

[C 15]

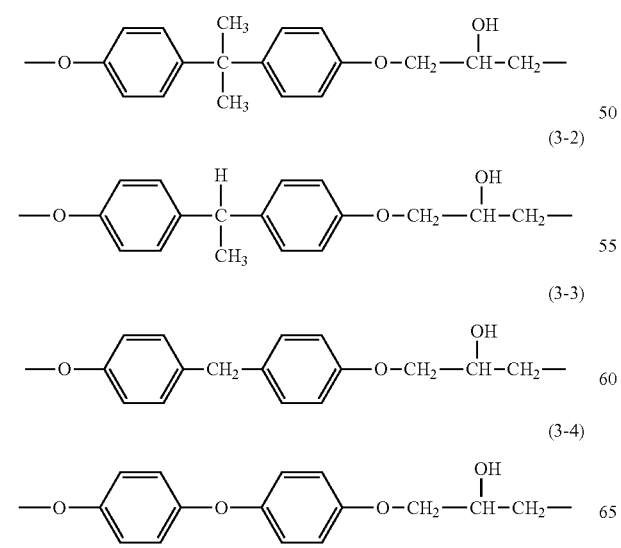

(3-1)
(3-2)
(3-3)
(3-4)

-continued

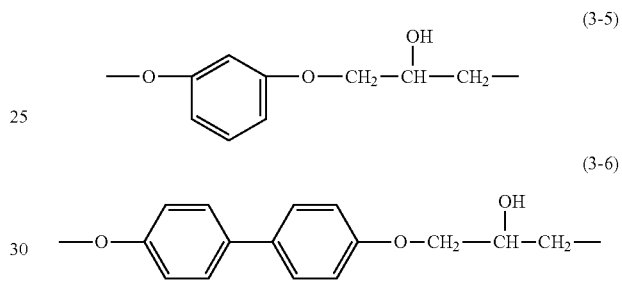

(3-5)
(3-6)

[C 16]

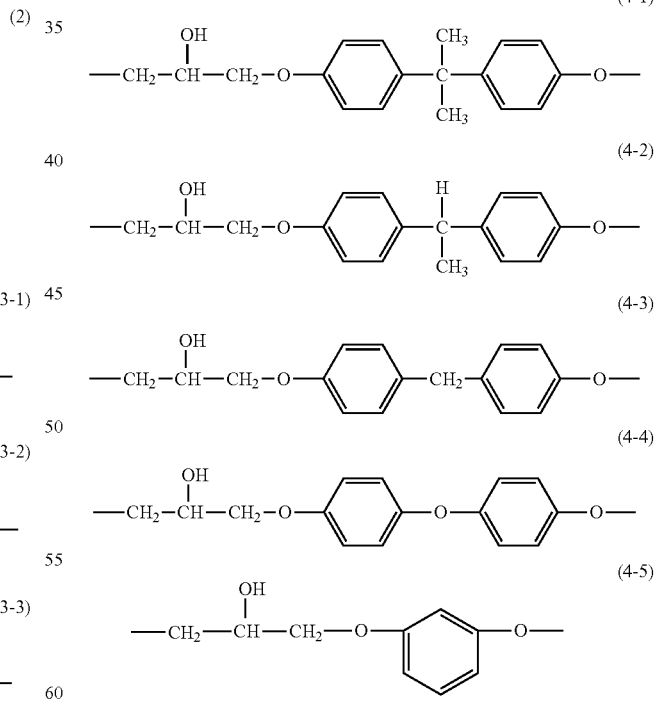

(4-1)
(4-2)
(4-3)
(4-4)
(4-5)
(4-6)

-continued

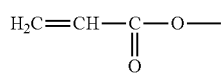
(5-1)

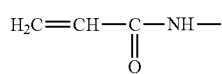
(5-2)

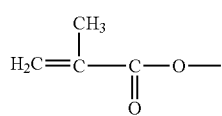
(5-3)

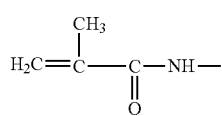
(5-4)

Preferably, the $P^1$ and $P^2$ are an acryloyloxy group (chemical formula (5-1)), or an acryloyl amino (chemical formula (5-2)) group from the viewpoint of, if, in a state in which the seal material composition has been drawn in a frame shape on the substrate, the liquid crystal material dropped onto the substrate by an ODF method expands and contacts the seal material composition: increasing the radical polymerization speed due to light irradiation; increasing the molecular weight of the polymerizable epoxy curing agent as much as possible; and effectively preventing elution into the liquid crystal layer (liquid crystal material).

Preferably, the $P^1$ and $P^2$ are a methacryloyloxy group (chemical formula (5-3)), or a methacryloyl amino group (chemical formula (5-4)), from the viewpoint of increasing the glass transition point of the seal material as much as possible, and increasing heat resistance.

Preferably, the $P^1$ and $P^2$ are an acryloyl amino group (chemical formula (5-2)), or a methacryloyl amino group (chemical formula (5-4)) from the viewpoint of allowing the seal material to capture water content from the outside of the liquid crystal cell by a hydrogen bond, and effectively suppressing a reaction between the thioisocyanate group-containing liquid crystal compound in the liquid crystal layer and water.

Preferably, the $P^1$ and $P^2$ are an acryloyloxy group (chemical formula (5-1)), or a methacryloyloxy group (chemical formula (5-3)) from the viewpoint of making the acquisition of water content from the outside difficult, for example. However, when the acryloyloxy group (chemical formula (5-1)), or the methacryloyloxy group (chemical formula (5-3)) is used, the water content acquisition capability of the seal material may be decreased, and water content may potentially pass through the seal material and reach the liquid crystal layer.

The $P^1$ and $P^2$ are selected, as appropriate, in consideration of the rate of polymerization, heat resistance of the seal material, and the water content acquisition capability of the seal material, for example. As described above, the $P^1$ and $P^2$ may be the same or different from each other.

Preferably, at least one of $P^1$ and $P^2$ is the acryloyl amino group represented by chemical formula (5-2), or the methacryloyl amino group represented by chemical formula (5-4).

The photoradical polymerization initiator is made of a compound that, upon being irradiated with visible light or the like, forms a radical by abstracting hydrogen in an amino group and the like in compounds existing therearound.

Preferably, the photoradical polymerization initiator includes a polymerizable functional group configured for radical polymerization.

Preferably, the photoradical polymerization initiator is a compound that forms a radical via a hydrogen abstraction reaction due to light of not less than 400 nm.

As the photoradical polymerization initiator, the compounds expressed by the following chemical formulas (18-1) and chemical formula (18-2) are utilized, for example.

[C 18]

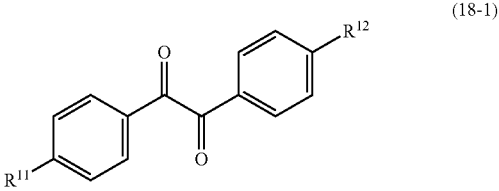
(18-1)

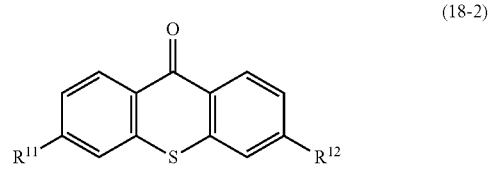
(18-2)

In chemical formulas (18-1) and (18-2), $R^{11}$ and $R^{12}$, which may be the same or different, represent a -$Sp^1$-$P^{11}$ group, hydrogen atom, halogen atom, a —CN group, a —$NO_2$ group, a —NCO group, a —NCS group, a —OCN group, a —SCN group, a —$SF_5$ group, or an alkyl group, an aralkyl group, a phenyl group, or a biphenyl group having 1 to 12 carbon atoms, wherein the alkyl group may be either straight-chained or branched. At least one of $R^{11}$ and $R^{12}$ includes a -$Sp^1$-$P^{11}$ group. $P^{11}$ represents an acryloyloxy group, a methacryloyloxy group, a vinyl group, a vinyl oxy group, an acryloyl amino group, or a methacryloyl amino group. $Sp^1$ represents a straight-chained, branched, or annular alkylene group or alkylene oxy group having 1 to 6 carbon atoms, or a straight-chain link. When at least one of $R^{11}$ and $R^{12}$ is an alkyl group, aralkyl group, phenyl group, or biphenyl group having 1 to 12 carbon atoms, the hydrogen atom in at least one of the $R^{11}$ and $R^{12}$ may be substituted with a fluorine atom, a chlorine atom, or a -$Sp^1$-$P^{11}$ group. The —$CH_2$-group in $R^{11}$ and $R^{12}$ may be substituted with a —O-group, a —S-group, a —NH-group, a —CO-group, a —COO-group, a —OCO-group, a —O—COO-group, a —$OCH_2$-group, a —$CH_2O$-group, a —$SCH_2$-group, a —$CH_2S$-group, a —$N(CH_3)$ -group, a —$N(C_2H_5)$ -group, a —$N(C_3H_7)$ -group, a —$N(C_4H_9)$- group, a —$CF_2O$-group, a —$OCF_2$-group, a —$CF_2S$-group, a —$SCF_2$-group, a —$N(CF_3)$-group, a —$CH_2CH_2$-group, a —$CF_2CH_2$-group, a —$CH_2CF_2$-group, a —$CF_2CF_2$-group, a —CH=CH-group, a —CF=CF-group, a —CC-group, a —CH=CH—COO-group, or a —OCO—CH=CH-group, as long as an oxygen atom, a sulfur atom, and a nitrogen atom are not adjacent to each other.

Specific examples of the photoradical polymerization initiator include compounds expressed by the following chemical formula (19-1) and chemical formula (19-2).

[C 19]

(19-1)

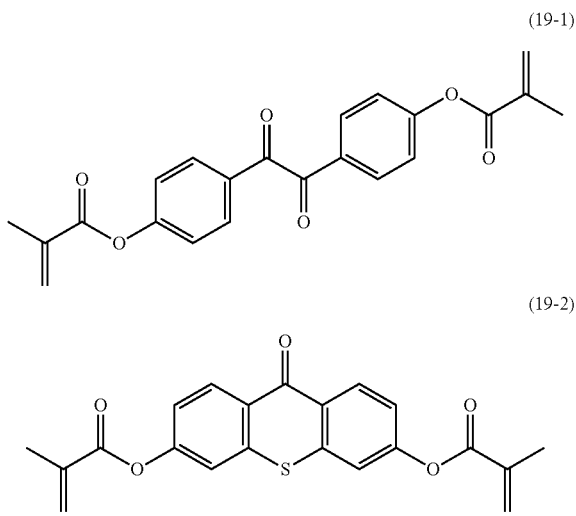

(19-2)

Preferably, the photoradical polymerization initiator forms a radical by absorbing visible light (for example, visible light of not less than 400 nm and preferably not less than 415 nm) on the longer-wavelength side than the wavelength absorbed by the isothiocyanate group-containing liquid crystal compound, so that photofragmentation of the isothiocyanate group-containing liquid crystal compound does not proceed.

The photoradical polymerization initiator is of a so-called hydrogen-abstraction type, where a radical is generated by abstracting hydrogen from an amino group. Such photoradical polymerization initiator forms a radical by abstracting a hydrogen atom in an amino group (for example, a secondary amino group, an acryloyl amino group, a methacryloyl amino group) of the polymerizable epoxy curing agent expressed by chemical formulas (1-1), (1-2), and (1-3). Accordingly, a combination of the hydrogen-abstraction type photoradical polymerization initiator expressed by chemical formulas (18-1) and (18-2) and the polymerizable epoxy curing agent expressed by chemical formulas (1-1), (1-2), and (1-3) is preferable.

As the thermal radical polymerization initiator, a compound that includes a polymerizable functional group forming a radical by heat and being configured for radical polymerization is utilized. For example, the thermal radical polymerization initiator is made of a compound expressed by the following chemical formula (6-1), or (6-2).

Preferably, the thermal radical polymerization initiator is used together with the photoradical polymerization initiator. In the present embodiment, it is necessary that polymerization of the polymerizable epoxy curing agent in the seal material composition proceed fast, and that the liquid crystal material having been dropped onto the substrate by an ODF method be suppressed from coming into contact with the seal material composition in uncured state. Accordingly, it is preferable to use not only the photoradical polymerization initiator but also the thermal radical polymerization initiator to promote the reaction of the polymerizable functional group. However, thermal radical polymerization initiators generally have a low starting efficiency compared to a photoradical polymerization initiator, and a thermally reactive functional group (for example, an azo group) tends to remain in an unreacted state in the seal material. An unreacted thermal radical polymerization initiator in the seal material may potentially elute into the liquid crystal layer and generate a radical in the liquid crystal layer. A radical in the liquid crystal layer is a cause of a decrease in voltage retention. Accordingly, in the present embodiment, as in the compound expressed by chemical formulas (6-1) and (6-2), the thermal radical polymerization initiator has a polymerizable functional group configured for radical polymerization introduced therein, whereby transfer of the unreacted thermal radical polymerization initiator into the seal material is suppressed.

The seal material composition may further include, as a compound (curable resin) including a polymerizable functional group configured for radical polymerization, a (meth) acrylate and the like having a (meth)acryloyl group.

The (meth) acrylate is not particularly limited as long as the object of the present invention is not compromised. An example is a urethane (meth)acrylate having a urethane linkage.

The urethane (meth)acrylate is not particularly limited as long as the object of the present invention is not compromised. Examples include derivatives of a diisocyanate, such as isophorone diisocyanate, and a reactive compound, such as acrylic acid or hydroxyethyl acrylate, that undergoes an addition reaction with isocyanate. These derivatives may be subjected to chain extension using caprolactone, polyol or the like. Examples of commercially available products include product names "U-122P", "U-340P", "U-4HA", and "U-1084A" (the above produced by Shim-Nakamura Chemical Co., Ltd.), and "KRM7595", "KRM7610", and "KRM7619" (the above produced by Daicel UCB Co., Ltd.).

Other examples of (meth)acrylate include methyl methacrylate, tetrahydrofurfuryl methacrylate, benzil methacrylate, isobornyl methacrylate, 2-hydroxyethyl methacrylate,

[C 20]

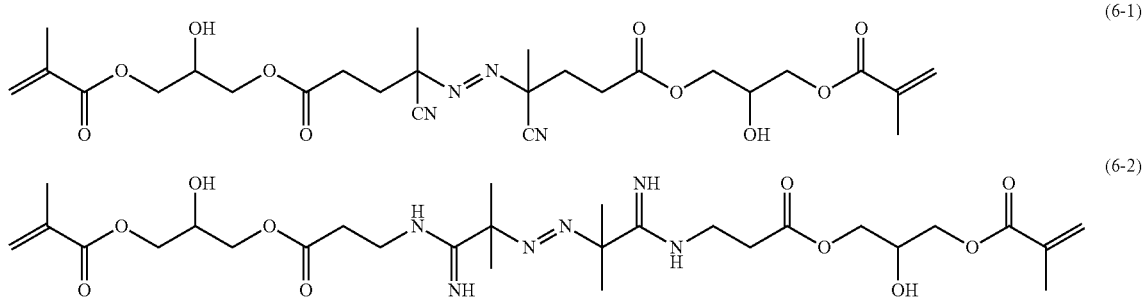

glycidyl methacrylate, (poly)ethylene glycol dimethacrylate, 1,4-butanediol dimethacrylate, 1,6-hexanediol dimethacrylate, trimethylol propane triacrylate, pentaerythritol triacrylate, and glycerin dimethacrylate.

The seal material composition may further include a silane coupling agent, a filler and the like.

The silane coupling agent has the function of, e.g., improving adhesion between the seal material composition after curing (i.e., seal material S) and the substrate. The silane coupling agent is not particularly limited as long as the object of the present invention is not compromised. Preferably, from the viewpoint of, e.g., highly effectively improving adhesion with the substrate and the like and preventing flowout into the liquid crystal material by forming a chemical linkage with the curable resin, examples include those made from γ-aminopropyltrimethoxysilane, γ-mercapto propyltrimethoxysilane, γ-glycidoxy propyltrimethoxysilane, or γ-isocyanate propyltrimethoxysilane, or an imidazolesilane compound having a structure in which an imidazole skeleton and an alkoxysilyl group are linked via a spacer group. These silane coupling agents may be used independently or in combinations of two or more of the above.

The filler may be added into the seal material composition for the purpose of, e.g., improving adhesion due to a stress distribution effect and improving the coefficient of linear expansion, as long as the object of the present invention is not compromised. Examples of the filler include inorganic fillers such as silica, diatom earth, alumina, zinc oxide, iron oxide, magnesium oxide, tin oxide, titanium oxide, magnesium hydroxide, aluminum hydroxide, magnesium carbonate, barium sulfate, gypsum, calcium silicate, talc, glass beads, sericite activated clay, bentonite, aluminum nitride, and silicon nitride. These may be used independently or in combinations of two or more of the above.

The seal material composition may further include, as appropriate and as needed, other components, such as a gelation agent or a sensitizer. As the seal material composition, solventless types are utilized basically.

(Scanned Antenna Producing Method)

A scanned antenna producing method (method of producing the liquid crystal cell C) includes a step of bonding the TFT substrate 101 and the slot substrate 201 to each other with the seal material S therebetween, and injecting the liquid crystal layer LC between the TFT substrate 101 and the slot substrate 201. The liquid crystal material may be injected by a method such as a one-drop-fill method (ODF method). Herein, a method of producing the liquid crystal cell C using the one-drop-fill method will be described.

First, on one (herein, the TFT substrate 101) of the TFT substrate 101 and the slot substrate 201 that has been prepared in advance, the seal material composition is provided in a frame shape using a seal dispenser. The seal material composition has blended therein an epoxy compound, a polymerizable epoxy curing agent, a photoradical polymerization initiator, a thermal radical polymerization initiator and the like. Then, on the substrate (TFT substrate 101), the liquid crystal material (including a thioisocyanate group-containing liquid crystal compound) is provided (dropped), using the ODF method. Thereafter, the seal material composition is irradiated with light having a wavelength of not less than 400 nm in an environment of about 35° C., whereby the seal material composition is provisionally cured.

Then, the substrate (TFT substrate 101) and the other substrate (slot substrate 201) are bonded with the provisionally cured seal material composition sandwiched therebetween. Thereafter, the seal material composition is heated for main curing by a cross-linking reaction between the polymerizable epoxy curing agent and the thermally reactive functional group (epoxy group), whereby the TFT substrate 101 and the slot substrate 201 are adhered to each other. Thus, the liquid crystal cell C can be fabricated by the one-drop-fill method.

After the liquid crystal cell C has been produced by the liquid crystal one-drop-fill method, the reflective conductive plate 65 is assembled on the cell side, as appropriate, so as to oppose the opposite surface of the slot substrate 201 (second dielectric substrate 51) via the dielectric material (air layer) 54. Through these steps, the scanned antenna of the present embodiment is produced.

In the foregoing embodiment, the seal material composition is applied in the liquid crystal cell utilized for a scanned antenna. However, as long as the object of the present invention is not compromised, the seal material composition may be applied in liquid crystal cells for other devices (for example, a liquid crystal cell for a liquid crystal lens in which liquid crystal is used as an optical element and the focal point distance is controlled by an applied voltage).

EXAMPLES

In the following, the present invention will be described in greater detail based on examples. The present invention is not limited in any sense by the examples.

Example 1

(Fabrication of Liquid Crystal Cell for Scanned Antenna)

A TFT substrate having the same basic configuration as the TFT substrate 101 of the liquid crystal cell of the scanned antenna 1000, and a slot substrate having the same basic configuration as the slot substrate 201 of the liquid crystal cell were prepared. The alignment film of the TFT substrate and the alignment film of the slot substrate were both formed using an aligning agent which will be described below.

As the aligning agent, an aligning agent obtained by dissolving the polyamic acid expressed by chemical formula (8) in an organic solvent was utilized. In chemical formula (8), X is the chemical formula (10-5), Y is the chemical formula (11-10), and Z was not provided. As the organic solvent, N-methyl-2-pyrrolidone (NMP) was used.

When forming the alignment film on each of the TFT substrate and the slot substrate, first, the aligning agent was provided using an inkjet method, and a coating made of the aligning agent was formed on the respective substrate. Thereafter, the coating on each substrate was heated (provisional sintering) for 2 minutes at the temperature condition of 80° C., and then the coating was heated (main sintering) for 10 minutes at the temperature condition of 200° C.

Thereafter, the coating on each substrate was subjected to a rubbing process (alignment process), whereby an alignment film made of the aligning agent was formed on the surface of each of the TFT substrate and the slot substrate.

On the surface of the TFT substrate (alignment film side), an optically and thermally curable seal material composition which will be described later was drawn in a frame shape, using a seal dispenser. Then, while cutting out light of not more than 400 nm using a cutting filter, the seal material composition was irradiated with light (wavelength: 280 nm to 430 nm) in an environment of about 35° C. for provisional curing. At the same time, a liquid crystal material (nematic-isotropic phase transition temperature (Tni): 140° C.) including the isothiocyanate group-containing liquid crystal compound expressed by chemical formula (7-1) and chemical formula (7-2) was dropped by the ODF method within a frame made of the seal material composition, whereby the liquid crystal material was extended on the TFT substrate. The liquid crystal material and the seal material composition contacted each other in about 2 to 3 minutes. The Tni of the liquid crystal material was determined by analyzing the thermal behavior of the liquid crystal material, using a thermal characteristics measurement device (produced by Mettler Toledo), a differential scanning calorimeter (DSC) and the like.

After the liquid crystal material extended sufficiently within the frame of the seal material composition, the TFT substrate and the slot substrate were bonded with the seal material composition sandwiched therebetween, and were heated in this state for 40 minutes at the temperature condition of 110° C., whereby the seal material composition was subjected to main curing, and a liquid crystal material realignment process was performed. In this way, the liquid crystal cell of example 1 was fabricated.

As the seal material composition, a composition was used which included: 3 mass % of the photoradical polymerization initiator expressed by chemical formula (19-1) including a polymerizable functional group that forms a radical by a hydrogen abstraction reaction with light of not less than 400 nm; 3 mass % of the thermal radical polymerization initiator expressed by chemical formula (6-1) including a polymerizable functional group; 15 mass % of a polymerizable epoxy curing agent (thermal curing agent) expressed by the following chemical formula (21); 40 mass % of a (meth) acrylic monomer; 20 mass % of an epoxy monomer; 2 mass % of a silane coupling agent; and 17 mass % of an inorganic filler.

[C 21]

$$P^1-\overset{H_2}{C}-\overset{OH}{\underset{|}{CH}}-\overset{H_2}{C}-R^2-\overset{H}{N}-\overset{H}{N}-\overset{O}{\underset{\|}{C}}-R_1-\overset{O}{\underset{\|}{C}}-\overset{H}{N}-\overset{H}{N}-\left(\overset{H_2}{C}-\overset{OH}{\underset{|}{CH}}-\overset{H_2}{C}-R^2-\overset{H}{N}-\overset{H}{N}-\overset{O}{\underset{\|}{C}}-R_1-\overset{O}{\underset{\|}{C}}-\overset{H}{N}-\overset{H}{N}\right)_n R^3-\overset{H_2}{C}-\overset{OH}{\underset{|}{CH}}-\overset{H_2}{C}-P^2 \qquad (21)$$

In chemical formula (21), n=1, $P^1$ is the following chemical formula (5-2), $P^2$ is the following chemical formula (5-1), $R^1$ is the following chemical formula (24), $R^2$ is the following chemical formula (3-1), and $R^3$ is the following chemical formula (4-1).

[C 22]

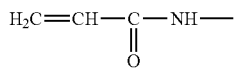

(5-2)

[C 23]

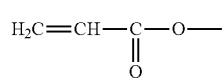

(5-1)

[C 24]

(24)

[C 25]

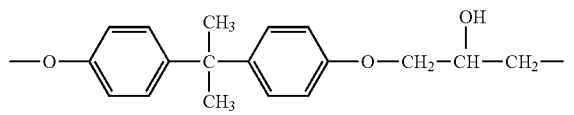

(3-1)

[C 26]

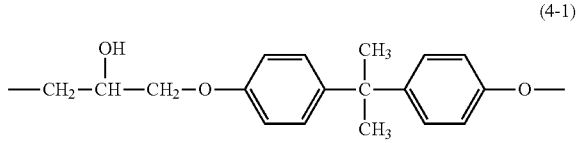

(4-1)

Comparative Example 1

A liquid crystal cell of comparative example 1 was fabricated in the same way as in example 1 by using a seal material composition prepared in the same way as in example 1, with the exception that, instead of the polymerizable epoxy curing agent, 15 mass % of adipic acid dihydrazide and 40 mass % of a diacrylate-based monomer (ethoxylated bisphenol A diacrylate, product name "A-BPE-30", produced by Shin-Nakamura Chemical Co., Ltd.) were used.

Comparative Example 2

A liquid crystal cell of comparative example 2 was fabricated in the same way as in example 1 using a seal material composition prepared in the same way as in example 1 with the exception that, instead of the photoradical polymerization initiator of example 1, 3 mass % of product name "Irgacure-OXE01" (1,2-octanedion 1-[4-(phenyl thio)-2-(O-benzoyl oxime), produced by BASF Japan) was used, and with the exception that, during provisional curing, ultraviolet light of 365 nm was irradiated.

Comparative Example 3

A liquid crystal cell of comparative example 3 was fabricated in the same way as in example 1 using a seal material composition prepared in the same way as in example 1, with the exception that the thermal radical polymerization initiator was not used.

(High Temperature Preservation Test)

The liquid crystal cells of example 1 and comparative examples 1 to 3 were left (aging) in a constant-temperature bath at 90° C. for 500 hours. Then, measurement of the voltage retention (VHR: Voltage Holding Ratio) and residual DC voltage (rDC) of the liquid crystal cells, and confirmation of the alignment state thereof before and after leaving (test start time (0 hours), and 500 hours after the start of test) were performed.

The voltage retention was measured using a Type 6254 VHR measurement system (produced by Toyo Technica Inc.), under the condition of 1 V and 70° C. The residual DC voltage (V) was measured by a flicker minimizing method after a DC offset voltage of 2V was applied to the liquid crystal cell for 2 hours in an oven at the temperature condition of 40° C. The alignment state of the liquid crystal cell was visually confirmed in a state in which the liquid crystal cell was sandwiched between a pair of crossed-Nicol polarizers. If there was no disturbance in the liquid crystal compound alignment state, the alignment state was evaluated to be "good"; if there was disturbance in the liquid crystal compound alignment state, the alignment state was evaluated to be "defective". The results are shown in Table 1.

TABLE 1

|  | 0 HOURS | | | 500 HOURS LATER | | |
| --- | --- | --- | --- | --- | --- | --- |
|  | VHR (%) | rDC (V) | ALIGNMENT STATE | VHR (%) | rDC (V) | ALIGNMENT STATE |
| EXAMPLE 1 | 88 | 0.04 | GOOD | 46 | 0.13 | GOOD |
| COMPARATIVE EXAMPLE 1 | 61 | 0.09 | GOOD | 18 | 0.83 | DEFECTIVE (DEPOSIT) |
| COMPARATIVE EXAMPLE 2 | 57 | 0.10 | GOOD | 22 | 0.80 | GOOD |
| COMPARATIVE EXAMPLE 3 | 78 | 0.06 | GOOD | 40 | 0.27 | GOOD |

Example 1 is the case in which the seal material composition including the polymerizable epoxy curing agent expressed by chemical formula (21), the photoradical polymerization initiator expressed by chemical formula (19-1) having the polymerizable functional group that generates a radical by a hydrogen abstraction reaction due to light of not less than 400 nm, and the thermal radical polymerization initiator expressed by chemical formula (6-1) was utilized. In the liquid crystal cell of example 1, as shown in Table 1,

[C 27]

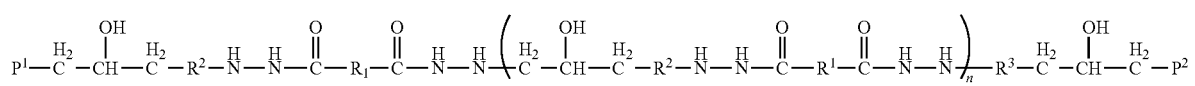

(27)

the alignment state was good both at the test start time (0 hours) and after having been left for 500 hours. The VHR at the test start time (0 hours) and after having been left for 500 hours was maintained at high values compared to comparative examples 1 to 3. The rDC at the test start time (0 hours) and after having been left for 500 hours was maintained at lower values compared to comparative examples 1 to 3.

Figure 1:
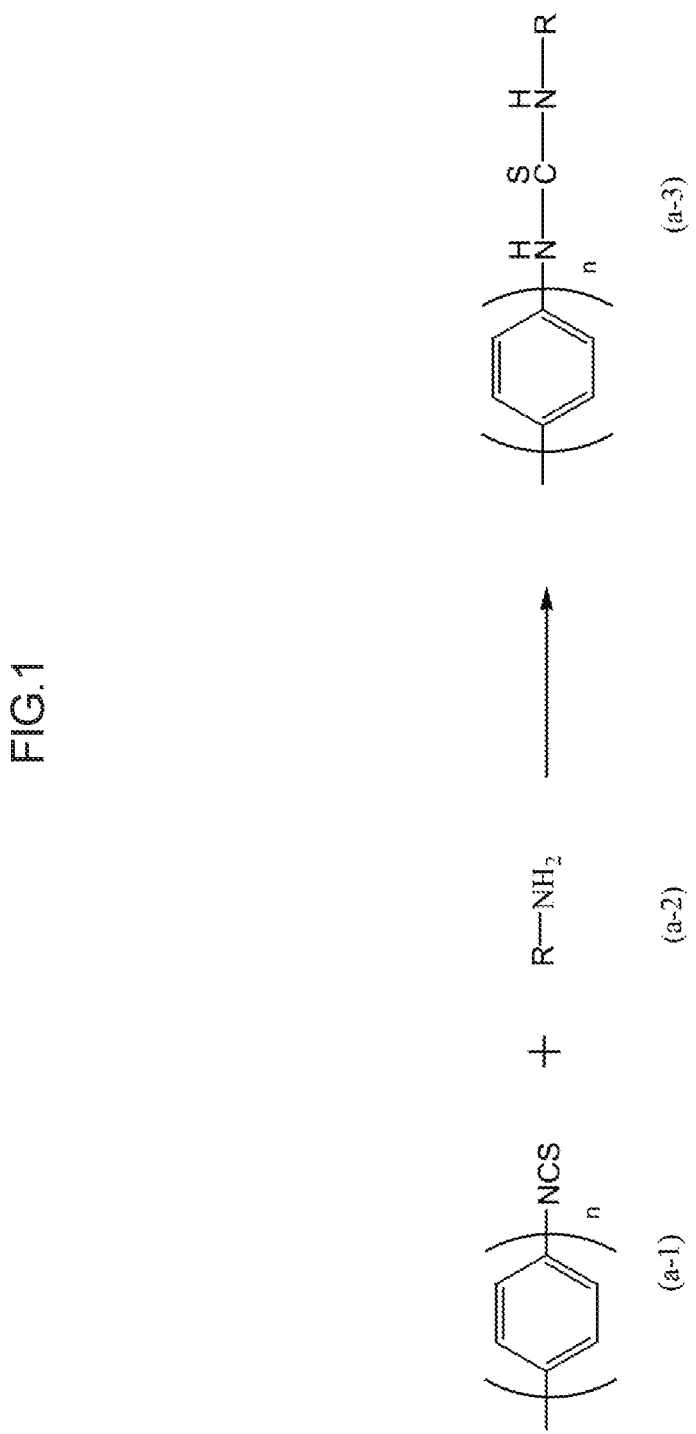
FIG. 1 is an illustrative diagram illustrating a reaction between an isothiocyanate group-containing liquid crystal compound (a-1) and a curing agent (a-2).

Comparative example 1 is the case in which, as the epoxy curing agent, the seal material composition including adipic acid dihydrazide and diacrylate-based monomer was utilized. In the liquid crystal cell of comparative example 1, while the alignment state at the test start time (0 hours) was good, the alignment state after having been left for 500 hours became defective. In the liquid crystal cell of comparative example 1, a deposit was generated in the vicinity of the seal material after having been left for 500 hours. It is estimated that the deposit was due to a reaction between the isothiocyanate group-containing liquid crystal compound in the liquid crystal material and the epoxy curing agent (such as adipic acid dihydrazide) (see FIG. 1), the reaction product having seeped into the liquid crystal layer as a compound insoluble to the liquid crystal material.

Comparative example 2 is the case in which the seal material composition including the photopolymerization initiator (IrgacureOXE01) that generates a radical by self-cleaving due to ultraviolet light was utilized. In the liquid crystal cell of comparative example 2, while the alignment state was good after having been left for 500 hours, the VHR after having been left for 500 hours was greatly decreased compared to the test start time (0 hours), and the rDC after having been left for 500 hours was increased. This is estimated to be because, after the seal material composition cured, the unreacted photopolymerization initiator eluted into the liquid crystal layer gradually, resulting in an increase in the radical concentration in the liquid crystal layer.

Comparative example 3 is the case in which the seal material composition not including the thermal radical polymerization initiator was utilized. In the liquid crystal cell of comparative example 3, the VHR after having been left for 500 hours was lower than in example 1, and the rDC after having been left for 500 hours became higher than in example 1.

Example 2

A liquid crystal cell of example 2 was fabricated in the same way as in example 1 using a seal material composition prepared in the same way as in example 1, with the exception that, as the polymerizable epoxy curing agent, 15 mass % of a compound expressed by the following chemical formula (27) was used, and that, as the photoradical polymerization initiator, 3 mass % of a compound expressed by chemical formula (19-2) was used.

In chemical formula (27), n=2, $P^1$ is the following chemical formula (5-3), $P^2$ is the following chemical formula (5-4), $R^1$ is the following chemical formula (2), $R^2$ is the following chemical formula (3-1), and $R^3$ is the following chemical formula (4-1).

[C 28]

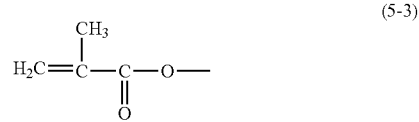

(5-3)

-continued

[C 29]
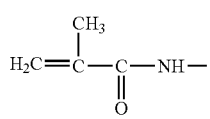
(5-4)

[C 30]
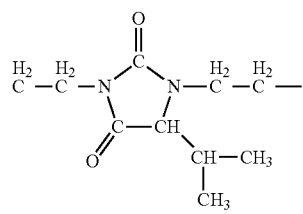
(2)

[C 31]
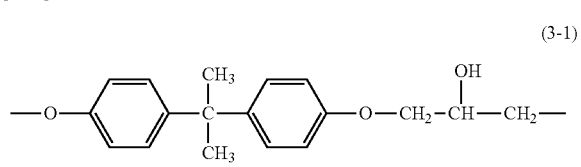
(3-1)

[C 33]
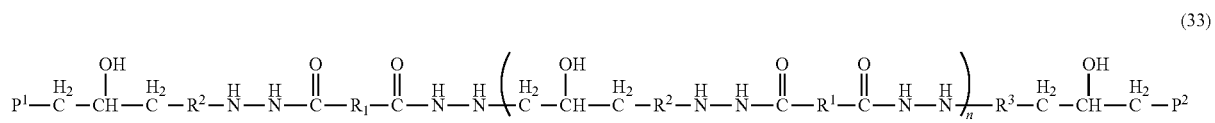
(33)

-continued

[C 32]
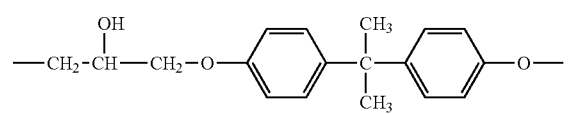
(4-1)

(High Temperature Preservation Test)

With respect to the liquid crystal cell of example 2, the above-described high temperature preservation test was performed, and, similarly to example 1, for example, measurement of the VHR and the residual DC voltage (rDC) of the liquid crystal cells, and confirmation of the alignment state thereof at the test start time (0 hours) and 500 hours after the start of test was performed. The results are shown in Table 2.

TABLE 2

|  | 0 HOURS | | | 500 HOURS LATER | | |
| --- | --- | --- | --- | --- | --- | --- |
|  | VHR (%) | rDC (V) | ALIGNMENT STATE | VHR (%) | rDC (V) | ALIGNMENT STATE |
| EXAMPLE 2 | 85 | 0.03 | GOOD | 50 | 0.12 | GOOD |

Example 2 is the case in which the seal material composition including the polymerizable epoxy curing agent expressed by chemical formula (27), the photoradical polymerization initiator expressed by chemical formula (19-2), and the thermal radical polymerization initiator expressed by chemical formula (6-1) was utilized. In the liquid crystal cell of example 2, as shown in Table 2, the alignment state was good both at the test start time (0 hours) and after having been left for 500 hours. The VHR and rDC at the test start time (0 hours) and after having been left for 500 hours were also good.

Example 3

A liquid crystal cell of example 3 was fabricated in the same way as in example 1 using a seal material composition prepared in the same way as in example 1, with the exception that, as the polymerizable epoxy curing agent, 15 mass % of a compound expressed by the following chemical formula (33) was used.

In chemical formula (33), n=1, $P^1$ is the following chemical formula (5-4), $P^2$ is the following chemical formula (5-4), $R^1$ is the following chemical formula (2), $R^2$ is the following chemical formula (3-5), and $R^3$ is the following chemical formula (4-5).

[C 34]
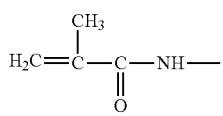
(5-4)

[C 35]
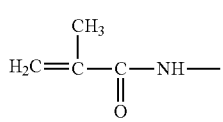
(5-4)

-continued

[C 36]

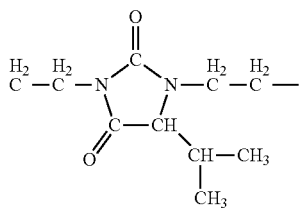
(2)

[C 37]

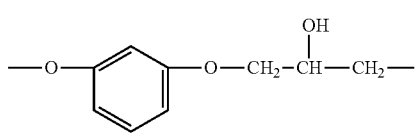
(3-5)

[C 38]

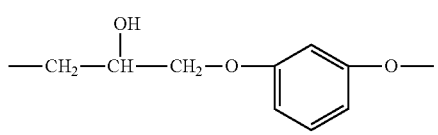
(4-5)

Example 4

A liquid crystal cell of example 4 was fabricated in the same way as in example 1 using a seal material composition prepared in the same way as in example 1 with the exception that, as the polymerizable epoxy curing agent, 15 mass % of compound expressed by chemical formula (33) was used, and, as the thermal radical polymerization initiator, 3 mass % of a compound expressed by chemical formula (6-2) was used.

Comparative Example 4

A liquid crystal cell of comparative example 4 was fabricated in the same way as in example 1 using a seal material composition prepared in the same way as in example 3, with the exception that, as the thermal radical polymerization initiator, azobisisobutyronitrile (AIBN) having no polymerize group was used.

(High Temperature Preservation Test)

With respect to the liquid crystal cells of examples 3, 4 and comparative example 4, the above-described high temperature preservation test was performed, and, as in example 1, for example, measurement of the VHR and residual DC voltage (rDC) of the liquid crystal cells, and confirmation of the alignment state thereof at the test start time (0 hours) and 500 hours after the start of test was performed. The results are shown in Table 3.

TABLE 3

|  | 0 HOURS | | | 500 HOURS LATER | | |
| --- | --- | --- | --- | --- | --- | --- |
|  | VHR (%) | rDC (V) | ALIGNMENT STATE | VHR (%) | rDC (V) | ALIGNMENT STATE |
| EXAMPLE 3 | 85 | 0.04 | GOOD | 43 | 0.13 | GOOD |
| EXAMPLE 4 | 87 | 0.03 | GOOD | 48 | 0.12 | GOOD |
| COMPARATIVE EXAMPLE 4 | 71 | 0.05 | GOOD | 23 | 0.46 | GOOD |

Examples 3, 4 are the case in which the seal material composition including the thermal radical polymerization initiator having a polymerizable functional group was utilized. Comparative example 4 is the case in which the seal material composition including the thermal radical polymerization initiator (AIBN) having no polymerizable functional group was utilized. In the liquid crystal cells of examples 3, 4 and comparative example 4, the alignment state at the test start time (0 hours) and after having been left for 500 hours was good. However, in the liquid crystal cell of comparative example 4, the results of the VHR and rDC at the test start time (0 hours) and after having been left for 500 hours deteriorated compared to examples 3, 4. This is estimated to be because the unreacted thermal radical polymerization initiator may have eluted into the liquid crystal layer, generating a radical due to heat.

Example 5

A liquid crystal cell of example 5 was fabricated in the same way as in example 1 using a seal material composition prepared in the same way as in example 1, with the exception that, as the polymerizable epoxy curing agent, 15 mass % of a compound expressed by the following chemical formula (39) was used.

[C 39]

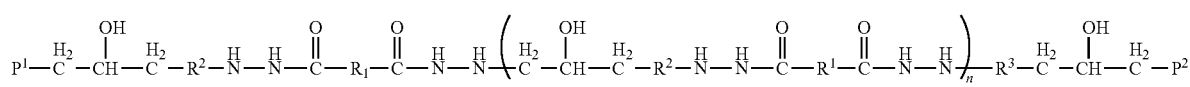
(39)

In chemical formula (39), n=1, $P^1$ is the following chemical formula (5-3), $P^2$ is the following chemical formula (5-3), $R^1$ is the following chemical formula (2), $R^2$ is the following chemical formula (3-5), and $R^3$ is the following chemical formula (4-5).

[C 40]

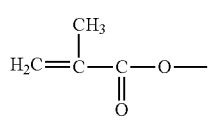
(5-3)

-continued

[C 41]

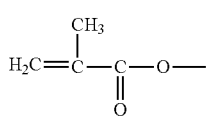
(5-3)

[C 42]

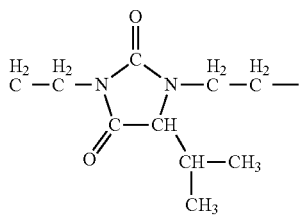
(2)

[C 43]

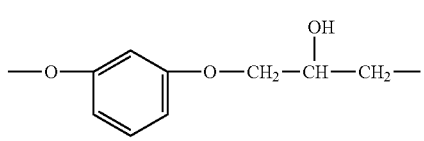
(3-5)

[C 44]

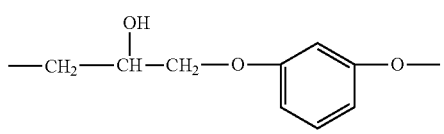
(4-5)

(High Temperature Preservation Test)

With respect to the liquid crystal cell of example 5, the above-described high temperature preservation test was performed, and, as in example 1, for example, measurement of the VHR and residual DC voltage (rDC) of the liquid crystal cell, and the alignment state thereof at the test start time (0 hours) and 500 hours after the start of test were performed. The results are shown in Table 4. Table 4 shows the results for example 3 for comparison. Example 3 is the case in which the seal material composition including the polymerizable epoxy curing agent in which an amino group (—NH) was introduced into the polymerizable functional group was utilized.

TABLE 4

|  | 0 HOURS | | | 500 HOURS LATER | | |
|---|---|---|---|---|---|---|
|  | VHR (%) | rDC (V) | ALIGNMENT STATE | VHR (%) | rDC (V) | ALIGNMENT STATE |
| EXAMPLE 3 | 85 | 0.04 | GOOD | 43 | 0.13 | GOOD |
| EXAMPLE 5 | 80 | 0.05 | GOOD | 37 | 0.15 | GOOD |

As shown in Table 4, compared to example 5, the results of the VHR and rDC at the test start time (0 hours) and after having been left for 500 hours were better with respect to example 3. This is estimated to be because the amide group (—CONH—) included in the polymerizable epoxy curing agent effectively acquired water content from the outside, and because it was possible to abstract hydrogen (H in —NH) effectively from the hydrogen-abstraction type photoradical polymerization initiator, enabling the start of a polymerization reaction.

EXPLANATION OF SYMBOLS

1: Dielectric substrate (First dielectric substrate)
3: Gate electrode
4: Gate insulating layer
5: Semiconductor layer
6D: Drain contact layer
6S: Source contact layer
7D: Drain electrode
7S: Source electrode
10: TFT
11: First insulating layer
15: Patch electrode
17: Second insulating layer
51: Dielectric substrate (Second dielectric substrate)
55: Slot electrode
55L: Lower layer
55M: Main layer
55U: Upper layer
57: Slot
57U: Slot electrode unit
58: Third electrode
70: Feed device
72: Feed pin
101: TFT substrate
201: Slot substrate
1000: Scanned antenna
U: Antenna unit (Antenna unit region)
CH1: Contact hole
LC: Liquid crystal layer
C: Liquid crystal cell
GD: Gate driver
GL: Gate bus line
GT: Gate terminal portion
SD: Source driver
SL: Source bus line
ST: Source terminal portion
PT: Transfer terminal portion
R1: Transmission/reception region
R2: Non-transmission/reception region
Rs: Seal region
S: Seal material
OM, OM1, OM2: Alignment film

The invention claimed is:
1. A seal material composition comprising:
an epoxy compound including an epoxy group; and
a polymerizable epoxy curing agent including a polymerizable functional group configured for cross-linking the epoxy groups and configured for radical polymerization in a single molecule; wherein
the polymerizable epoxy curing agent is made of a compound expressed by the following chemical formula (1-1), (1-2), or (1-3):

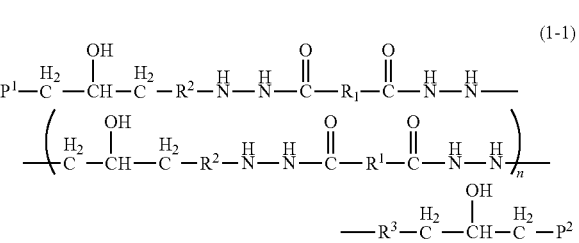
(1-1)

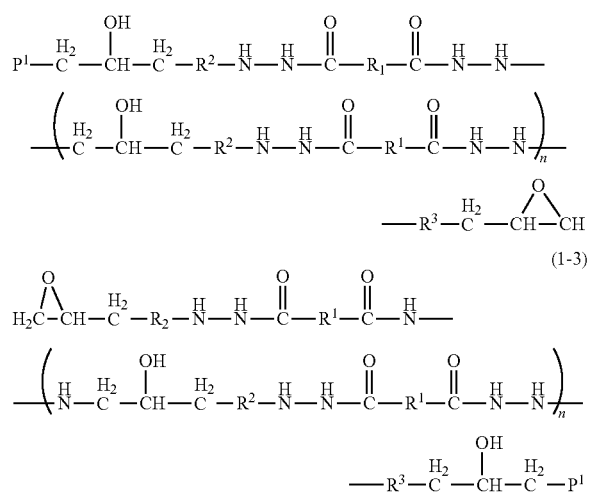

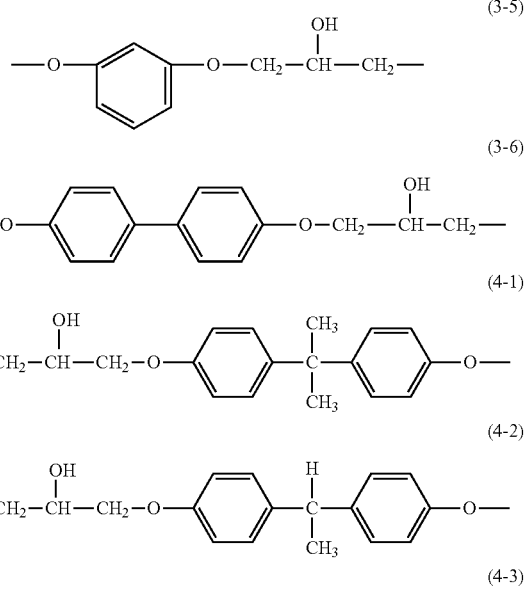

where in chemical formulas (1-1), (1-2), and (1-3), n is an integer of 0 to 10, $R^1$ is an alkylene group having 1 to 10 carbon atoms or a group represented by the following chemical formula (2), $R^2$ is a group represented by the following chemical formula (3-1), (3-2), (3-3), (3-4), (3-5), or (3-6), $R^3$ is a group represented by the following chemical formula (4-1), (4-2), (4-3), (4-4), (4-5), or (4-6), and $P^1$ and $P^2$ are groups which are represented by the following chemical formula (5-1), (5-2), (5-3), or (5-4) and which may be the same or different from each other

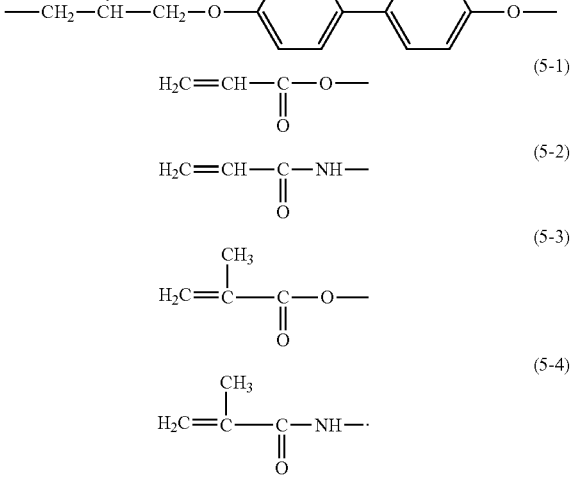

2. The seal material composition according to claim 1, wherein, one of the $P^1$ and $P^2$ is an acryloyl amino group represented by the chemical formula (5-2) or a methacryloyl amino group represented by the chemical formula (5-4).

3. The seal material composition according to claim 1, further comprising a photoradical polymerization initiator that forms a radical by abstracting hydrogen.

4. The seal material composition according to claim 3, wherein the photoradical polymerization initiator includes a polymerizable functional group configured for radical polymerization.

5. The seal material composition according to claim 3, wherein the photoradical polymerization initiator forms a radical via a hydrogen abstraction reaction using light of not less than 400 nm.

6. The seal material composition according to claim 1, further comprising a thermal radical polymerization initiator including a polymerizable functional group configured for radical formation and radical polymerization due to heat.

7. The seal material composition according to claim 6, wherein the thermal radical polymerization initiator is made from a compound expressed by following chemical formula (6-1) or (6-2)

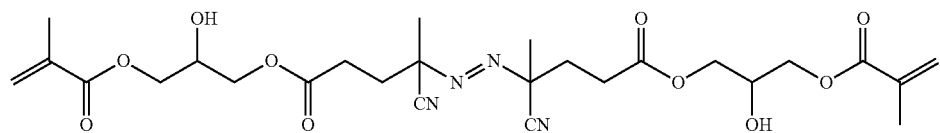

(6-1)

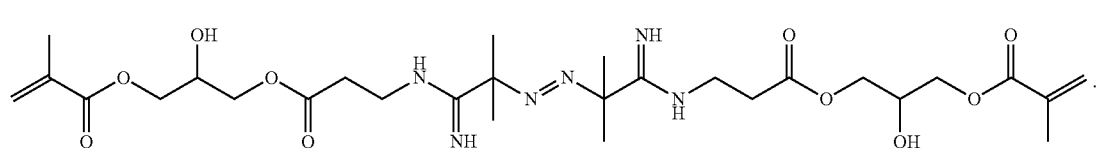

(6-2)

8. A liquid crystal cell comprising:
a liquid crystal layer;
a pair of substrates including a first substrate and a second substrate facing each other with the liquid crystal layer sandwiched therebetween; and
a seal material made of a cured product of the seal material composition according to claim 1, wherein the seal material is interposed between the pair of substrates and adhered to each of the pair of substrates while surrounding the liquid crystal layer.

9. A scanned antenna having a plurality of antenna units being arrayed thereon, the scanned antenna comprising:
a TFT substrate including a first dielectric substrate, a plurality of TFTs supported on the first dielectric substrate, and a plurality of patch electrodes electrically connected to the TFTs;
a slot substrate including a second dielectric substrate and a slot electrode having a plurality of slots formed on a first main surface of the second dielectric substrate;
a liquid crystal layer disposed between the TFT substrate and the slot substrate;
a reflective conductive plate disposed so as to oppose a second main surface on an opposite side to the first main surface of the second dielectric substrate, with a dielectric material layer therebetween; and
a seal material made of a cured product of the seal material composition including:
an epoxy compound including an epoxy group; and
a polymerizable epoxy curing agent including a polymerizable functional group configured for cross-linking the epoxy groups and configured for radical polymerization in a single molecule; wherein
the seal material is interposed between the TFT substrate and the slot substrate and adhered to each of the TFT substrate and the slot substrate while surrounding the liquid crystal layer.

10. The scanned antenna according to claim 9, wherein the liquid crystal layer includes an isothiocyanate group-containing liquid crystal compound.

11. The scanned antenna according to claim 10, wherein the isothiocyanate group-containing liquid crystal compound includes a structure expressed by one of following chemical formulas (7-1) and chemical formula (7-2):

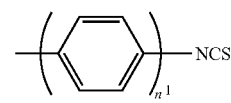

(7-1)

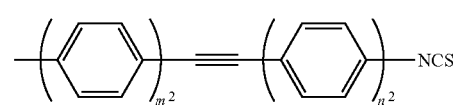

(7-2)

where in the chemical formulas (7-1) and (7-2), $n^1$, $m^2$, and $n^2$ are integers of 1 to 5, and H in the phenylene group may be substituted with F or Cl.

12. A seal material composition comprising:
an epoxy compound including an epoxy group;
a polymerizable epoxy curing agent including a polymerizable functional group configured for cross-linking the epoxy groups and configured for radical polymerization in a single molecule; and
a photoradical polymerization initiator that forms a radical by abstracting hydrogen; wherein
the photoradical polymerization initiator includes a polymerizable functional group configured for radical polymerization.

13. The seal material composition according to claim 12, wherein
the polymerizable epoxy curing agent is made of a compound expressed by the following chemical formula (1-1), (1-2), or (1-3):

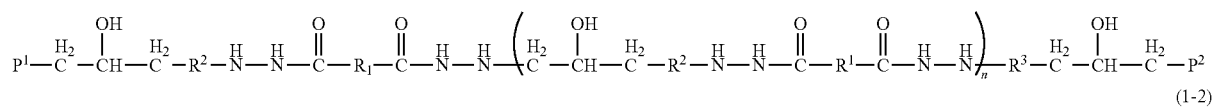

(1-1)

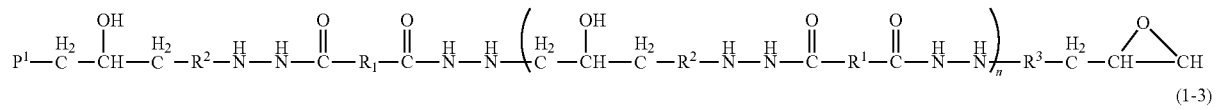

(1-2)

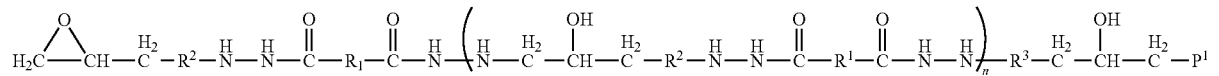

(1-3)

where in chemical formulas (1-1), (1-2), and (1-3), n is an integer of 0 to 10, $R^1$ is an alkylene group having 1 to 10 carbon atoms or a group represented by the following chemical formula (2), $R^2$ is a group represented by the following chemical formula (3-1), (3-2), (3-3), (3-4), (3-5), or (3-6), $R^3$ is a group represented by the following chemical formula (4-1), (4-2), (4-3), (4-4), (4-5), or (4-6), and $P^1$ and $P^2$ are groups which are represented by the following chemical formula (5-1), (5-2), (5-3), or (5-4) and which may be the same or different from each other

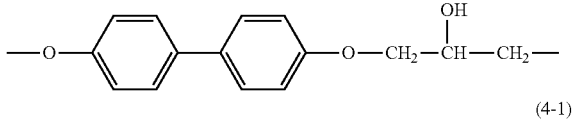

(2)

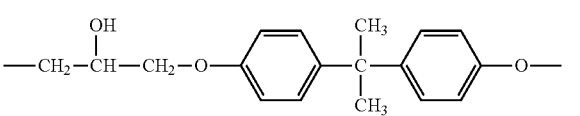

(3-1)

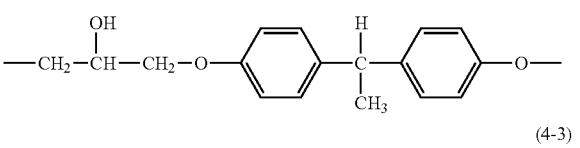

(3-2)

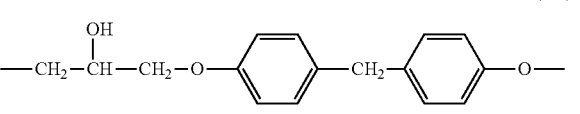

(3-3)

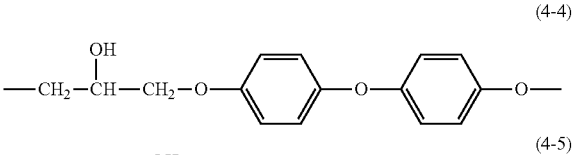

(3-4)

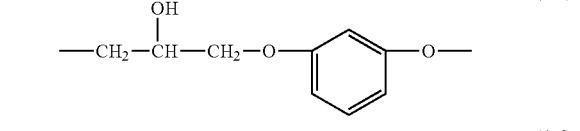

(3-5)

-continued

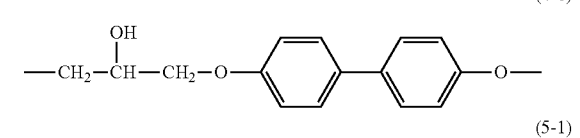

(3-6)

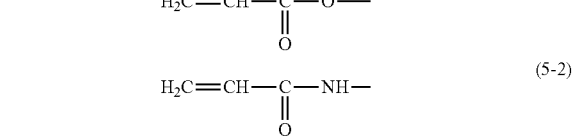

(4-1)

(4-2)

(4-3)

(4-4)

(4-5)

(4-6)

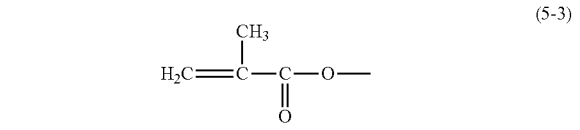

(5-1)

(5-2)

(5-3)

-continued

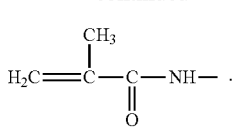
(5-4)

14. The seal material composition according to claim 13, wherein, one of the $P^1$ and $P^2$ is an acryloyl amino group represented by the chemical formula (5-2) or a methacryloyl amino group represented by the chemical formula (5-4).

15. The seal material composition according to claim 12, wherein the photoradical polymerization initiator forms a radical via a hydrogen abstraction reaction using light of not less than 400 nm.

16. The seal material composition according to claim 12, further comprising a thermal radical polymerization initiator including a polymerizable functional group configured for radical formation and radical polymerization due to heat.

17. The seal material composition according to claim 16, wherein the thermal radical polymerization initiator is made from a compound expressed by following chemical formula (6-1) or (6-2)

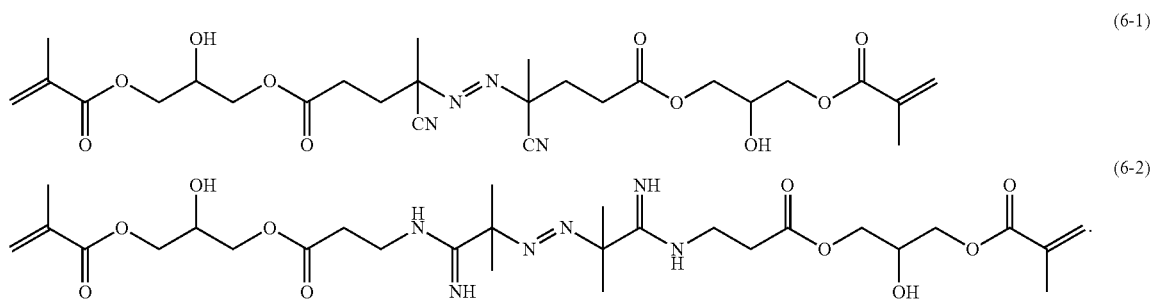

18. A liquid crystal cell comprising: a liquid crystal layer; a pair of substrates including a first substrate and a second substrate facing each other with the liquid crystal layer sandwiched therebetween; and
a seal material made of a cured product of the seal material composition according to claim 12, wherein the seal material is interposed between the pair of substrates and adhered to each of the pair of substrates while surrounding the liquid crystal layer.

* * * * *